(12) United States Patent
Maeda et al.

(10) Patent No.: US 7,737,461 B2
(45) Date of Patent: Jun. 15, 2010

(54) PACKAGE FOR STORING LIGHT EMITTING ELEMENT AND METHOD FOR PRODUCING PACKAGE FOR STORING LIGHT EMITTING ELEMENT

(75) Inventors: Masakatsu Maeda, Shunan (JP);
Yasuyuki Yamamoto, Shunan (JP);
Yukihiro Kanechika, Shunan (JP)

(73) Assignee: Tokuyama Corporation (JP)

( * ) Notice: Subject to any disclaimer, the term of this patent is extended or adjusted under 35 U.S.C. 154(b) by 294 days.

(21) Appl. No.: 11/659,158

(22) PCT Filed: Aug. 3, 2005

(86) PCT No.: PCT/JP2005/014223
§ 371 (c)(1),
(2), (4) Date: Feb. 1, 2007

(87) PCT Pub. No.: WO2006/013899
PCT Pub. Date: Feb. 9, 2006

(65) Prior Publication Data
US 2007/0272938 A1 Nov. 29, 2007

(51) Int. Cl.
*H01L 33/00* (2010.01)
(52) U.S. Cl. .................. 257/99; 257/E33.072
(58) Field of Classification Search .................. 257/99, 257/712, 647
See application file for complete search history.

(56) References Cited

FOREIGN PATENT DOCUMENTS

| JP | (1994) 6-092739 A | 4/1994 |
|---|---|---|
| JP | (1996) 8-274378 A | 10/1996 |
| JP | 2002-232017 A | 8/2002 |
| JP | 2003-273405 A | 9/2003 |
| JP | 2004-152952 A | 5/2004 |
| JP | 2004152952 A * | 5/2004 |
| JP | 2004-207678 A | 7/2004 |
| JP | 2004-315329 A | 11/2004 |

* cited by examiner

*Primary Examiner*—Sue Purvis
*Assistant Examiner*—Selim Ahmed
(74) *Attorney, Agent, or Firm*—The Webb Law Firm

(57) ABSTRACT

A light-emitting element storing package which ensures the efficient reflection of light emitted by a light-emitting element by a reflector frame and thereby improves the brightness of the emitted light, and a method of manufacturing the same are provided. In a light-emitting element storing package includes: an insulating substrate consisting of a ceramic board, a reflector frame composed of a ceramic material, joined to the upper surface of the substrate along its outer edge and having an inner wall surface defining a light-reflecting surface, and a wiring pattern layer formed on the upper surface of the substrate for connection with a light-emitting element, a light-emitting element storing concave portion, which is defined by the substrate and the reflector frame, and in which the light-emitting element is mounted on the wiring pattern layer, the reflector frame is mainly composed of nitride ceramics and its light-reflecting surface is composed of white ceramics.

8 Claims, 11 Drawing Sheets (A)

(B)

(C)

(D)

PACKAGE FOR STORING LIGHT EMITTING ELEMENT AND METHOD FOR PRODUCING PACKAGE FOR STORING LIGHT EMITTING ELEMENT

TECHNICAL FIELD

This invention relates to a light-emitting element storing package used for storing a light-emitting element, such as a light-emitting diode (LED).

BACKGROUND ART

Light-emitting elements, such as light-emitting diodes, have recently come to be used widely as, for example, a source of light for electroluminescent display panels, or a source of backlight for cellular phones or personal computers, owing to the improved brightness of light thereby emitted. These light-emitting elements are used in packages in which they are stored.

Conventionally, as for a light-emitting element storing package, a light-emitting element storing package disclosed in Patent Document 1 (Japanese Patent Provisional Publication No. 2002-232017) is proposed.

The light-emitting element storing package 100 disclosed in the Patent Document 1, as shown in FIG. 6, has an insulating substrate 111, a reflector frame 112 disposed along the outer periphery of the substrate 111. Furthermore, in the package 100, a light-emitting element storing concave portion 119 is defined between the substrate 111 and the reflector frame 112.

At the position of the concave portion 119 of the insulating substrate 111, i.e. at the just under the position of the concave portion 119, a wiring through-hole (so called "via-hole") 116, which is penetrated vertically through the substrate 111, is provided.

The wiring through-hole 116 is filled with a conductive member 117 and wiring pattern layers 114 and 115, which are respectively formed on the upper and lower surfaces of the substrate 111, are electrically connected to each other through the conductive member 117. As a result, the light-emitting element 118 mounted on the upper wiring pattern layer 114 may be electrically connected with an external electrical circuit.

After the light-emitting element 118 is mounted on the bottom of the light-emitting element storing concave portion 119, the concave portion 119 is filled with a transparent resin, such as an epoxy resin so that the light-emitting element is sealed gas-tightly. As a result, a light-emitting device as a final product is produced.

In the light-emitting element storing package 100, a light-reflecting layer 113 is formed on the inner wall surface of the concave portion 119, i.e. on the inner wall surface of the reflector frame 112. The light emitted by the light-emitting element 118 is reflected by the light-reflecting layer 113 so that brightness of the light-emitting element 118 is substantially increased.

As a result, the light emitted by the light-emitting element 118 shines brightly by the action of this light-reflecting layer 113, so that an electroluminescent display panel may display bright and very clear characters and images.

As for the light-reflecting layer 113, for example, gold, silver or nickel, etc. is utilized. In addition, for example, a metallized metal layer is previously formed on the inner concave wall surface of the insulating substrate 111 and gold, silver or nickel, etc. is formed on the metallized metal layer by plating, so that the light-reflecting layer 113 is formed on the inner wall surface of the reflector frame 112.

However, in such light-emitting element storing package 100 disclosed in the Patent Document 1, the light-reflecting layer 113 is formed on the whole inner wall surface of the reflector frame 112. Therefore, lower portion of the light-reflecting layer 113 and the wiring pattern layer 114 at the bottom of the light-emitting element storing concave portion 119 is short-circuited, so that there is a possibility of impairing the function of the light-emitting element 118.

For this reason, in a light-emitting element storing package 200 of Patent Document 2 (Japanese Patent Provisional Publication No. 2003-273405), as shown in FIG. 7, a light-reflecting layer 213 is formed on the inner wall surface of the light-emitting element storing concave portion 219 not to cover whole inner wall surface of the reflector frame 212. Moreover, in the package 200, the light-reflecting layer 213 is formed as it is spaced apart from the bottom of the light-emitting element storing concave portion 219.

As a result, the electrical short-circuit between the light-reflecting layer 213 and a wiring pattern layer 214 at the bottom of the light-emitting element storing concave portion 219 is prevented effectively.

Furthermore, in the package 200, an insulating layer 220 is disposed between the light-emitting layer 213 and the wiring pattern layer 214 to ensure the prevention of their electrical short-circuiting.

In addition, in the light-emitting element storing package 200 disclosed in Patent Document 2, as shown in FIG. 7, there is no wiring through-hole in an insulating substrate 211, and a wiring pattern layer 201, which is provided between the reflector frame 212 and the substrate 211, is extended along the outer surface of the substrate 211. As a result, the wiring pattern layers 214 and 215, which are respectively formed on the upper and lower surfaces of the substrate 211, are electrically connected to each other.

However, in the light-emitting element storing package 200 disclosed in this Patent Document 2, the light-reflecting layer 213 is formed as it is spaced apart from the bottom of the light-emitting element storing concave portion 219 and the insulating layer 220 is disposed therebetween. Therefore, the light emitted from the light-emitting element 218 is not reflected by the surface of the insulating layer 220 so that brightness is substantially lowered.

Furthermore, according to both of Patent Documents 1 and 2, the light-reflecting layer is of, for example, gold, silver or nickel. However, gold and nickel have a light reflectance of as low as 50% or less for a wavelength of 400 nm or less. In addition, silver generally has a reflectance of as low as 50% or less for a wavelength of 350 nm or less, since it has absorption at a wavelength of 300 to 350 nm.

However, a light-emitting element for a white LED usually emits blue or near-ultraviolet light and it is converted to various wavelengths by various fluorescent materials. Therefore, it is important for improving its brightness that a light emitted from a light-emitting element having a wavelength of 350 to 430 nm is efficiently reflected.

Therefore, in Patent Document 3 (Japanese Patent Provisional Publication No. 8 (1996)-274378), as shown in FIG. 8, a light-reflecting layer is not formed and an insulating substrate 312 itself formed from a white sintered compact of aluminum oxide having relatively high light-reflecting property. As a result, a light emitted from a light-emitting element 318 is reflected by a light-reflecting surface 320.

In addition, in the light-emitting element storing package 300 disclosed in Patent Document 3, as shown in FIG. 8, a wiring through-hole 316 is formed. The wiring through-hole 316 is extending from the lower portion of a light-emitting element storing concave portion 319 of the insulating substrate 312 to the bottom surface of the insulating substrate 312 through an intermediate wiring portion 313 formed in the middle position of the insulating substrate 312.

The wiring through-hole 316 is filled with a conductive member 317 and wiring pattern layers 314 and 315, which are respectively formed on the upper and lower surfaces of the insulating substrate 312, are electrically connected to each other. Consequently, the light-emitting element 318, which is mounted on the upper wiring pattern layer 314, may be electrically connected with an external electrical circuit.

However, the white sintered compact of aluminum oxide constituting the substrate 312 according to Patent Document 3 has a relatively low thermal conductivity in the order of about 20 W/m·K despite its reflectance of 50% or more for light having a wavelength of 350 to 400 nm. Therefore, the heat from the light-emitting element 318 is thermally accumulated in the light-emitting element storing package 300 and the accumulated heat can not radiate therefrom so that there is possibility of damaging the light-emitting element 318.

Moreover, Patent Document 4 (Japanese Patent Provisional Publication No. 2004-152952) discloses a light-emitting element storing package in which a reflector frame is composed of white ceramics.

However, in this Patent Document, the ceramics actually used for the reflector frame are $SiO_2$—$Al_2O_3$—$MgO$—$ZrO_2$—$CaO$ ceramics having a specific composition, which is mainly consisting of alumina. As apparent from this Patent Document, the ceramic has 96.25% by weight of alumina content so that it has a low thermal conductivity.

Patent Document 4 also states that, as a reflectance of 80% or higher for light having a wavelength of 400 to 700 nm with respect to aluminum nitride (AlN), the amount of $Er_2O_3$ in a sintered compact of aluminum nitride is preferably from 1 to 10% by weight based on the weight of the sintered compact.

However, in Patent Document 4, there is no specific embodiment corresponding to this statement. In addition, in fact, it has been confirmed that no white sintered compact of aluminum nitride can be obtained by sintering a material having an $Er_2O_3$ content of 1 to 10% by weight (see Comparative Example 4 below).

Patent Document 1 (Japanese Patent Provisional Publication No. 2002-232017)

Patent Document 2 (Japanese Patent Provisional Publication No. 2003-273405)

Patent Document 3 (Japanese Patent Provisional Publication No. 8 (1996)-274378)

Patent Document 4 (Japanese Patent Provisional Publication No. 2004-152952)

SUMMARY OF THE INVENTION

Under these circumstances, it is an object of this invention to provide a light-emitting element storing package, which ensures the efficient reflection of light emitted from a light-emitting element by a reflector frame and thereby improves its brightness, without having any light-reflecting layer formed on the inner wall surface of the reflector frame and without allowing any short-circuiting of a wiring pattern layer formed on the bottom of a light-emitting element storing cavity; and a method of manufacturing the same.

It is another object of this invention to provide a light-emitting element storing package, which ensures the efficient reflection of light emitted from a light-emitting element by a reflector frame having a light-reflecting layer formed on its whole inner wall surface and thereby improves the brightness of the emitted light, without allowing any short-circuiting of a wiring pattern layer formed on the bottom of a light-emitting element storing cavity; and a method of manufacturing the same.

It is still another object of this invention to provide a light-emitting element storing package having a reflector frame of relatively high thermal conductivity which dissipates heat generated by a light-emitting element without allowing it to accumulate in the package and damage the element; and a method of manufacturing the same.

The above objects of this invention are essentially attained by a light-emitting element storing package including:

an insulating substrate composed of a ceramic having board like configuration, a reflector frame composed of a ceramic material, joined to the upper surface of the substrate along its outer edge and having an inner wall surface defining a light-reflecting surface, a wiring pattern layer formed on the upper surface of the substrate for connection with a light-emitting element, and a light-emitting element storing concave portion, defined by the substrate and the reflector frame therebetween, in which the light-emitting element is mounted on the wiring pattern layer in the light-emitting element storing concave portion, wherein the reflector frame is mainly composed of nitride ceramics and the light-reflecting surface of the reflector frame is composed of white ceramics.

In the light-emitting element storing package according to this invention, the light-reflecting surface of the reflector frame is consisting of white ceramics having a high reflectance of light. As a result, light emitted from the light-emitting element can be efficiently and steadily reflected by the reflector frame and therefore the brightness of the light-emitting element can be improved.

Furthermore, in the package of this invention, there is no requirement that a metallic light-reflecting layer is provided on the inner wall surface of the reflector frame as conventional technique. Therefore, the wiring pattern layer, which is formed on the bottom surface of the light-emitting element storing concave portion, is not short-circuited, so that the light emitting function of the light-emitting element is not prevented.

Moreover, in this invention, the inner wall surface of the reflector frame in the light-emitting element storing concave portion and whole surface of the insulating substrate having a board configuration composed of ceramics excluding the surface on which the wiring pattern layer is formed can be as a light reflecting surface. Consequently, efficiency of light reflectivity is enhanced.

As the reflector frame is composed of nitride ceramics of high thermal conductivity, the heat generated by the light-emitting element is not accumulated in the light-emitting element storing package and the heat is dissipated through the reflector frame. As a result, there is no possibility that the light-emitting element is damaged by heat.

Specifically, if the insulating substrate is composed of nitride ceramics, heat radiation is efficiently accomplished through the insulating substrate. Therefore, the damaging of the element by heat can be more effectively prevented.

In addition, the light-emitting element storing package of this invention is characterized in that the white ceramics forming the light-reflecting surface may have a reflectance of 50% or more for light having a wavelength of 350 to 800 nm.

If the light reflectance of the white ceramics forming the light-reflecting surface falls within that range, it can reflect the light of the light-emitting element efficiently to the light output side and thereby improve its brightness.

Furthermore, the light-emitting element storing package of this invention is characterized in that the white ceramics forming the light-reflecting surface may have a reflectance of 55% or more for light having a wavelength of 400 nm.

In this way, its reflectance for light having a wavelength of 400 nm is so high. Therefore, for example, where a white LED is used as the light-emitting element, the package of this invention can efficiently reflect the light emitted by the light-emitting element and having a wavelength of 350 to 430 nm and improve its brightness, since the light-emitting element usually emits blue or near-ultraviolet light and the emitted light is converted to various wavelengths by various fluorescent materials.

The light-emitting element storing package according to this invention may be classified into three types by the nature of its reflector frame:

(1) The reflector frame as a whole is composed of white nitride ceramics;

(2) The main body of the reflector frame is composed of nitride ceramics and at least surface portion constituting a light-reflecting surface is consisting of an oxide layer which is obtained by oxidizing the nitride ceramics; and (3) The main body of the reflector frame is composed of nitride ceramics and at least a surface portion constituting a light-reflecting surface consists of white ceramics which differs from the nitride ceramics.

Among the light-emitting element storing package according to this invention, the package having a reflector frame of the type (1) is advantageously easy to manufacture, since the principal material of the reflector frame and its light-reflecting surface are consisting of the same material.

Especially, where the reflector frame is consisting of white aluminum nitride ceramics having a thermal conductivity of 140 (W/m·K) or more and a density of 3.10 g/cm$^3$ or more, the package is excellently high in all of heat dissipativity, mechanical strength and light reflectance.

In addition, such white aluminum nitride ceramics have hitherto not been known, but have for the first time been obtained by sintering a composition, which is comprising an aluminum nitride powder and a compound containing an alkaline earth metal added thereto as a sintering assistant, in a weak reducing atmosphere.

Moreover, among the light-emitting element storing package according to this invention, where the package is a reflector frame of the type (2) or (3), there is no requirement that the material of the main body of the reflector frame is same material of the light-reflecting surface.

Therefore, the flexibility of material selection is high, and as for the material of the reflector frame, a material of higher thermal conductivity may be utilized. Furthermore, the light-reflecting surface may be consisting of the material having higher light reflectance.

It is a further object of this invention to provide a method of manufacturing a light-emitting element storing package as defined above.

That is to say, in this invention, as for a method for effectively manufacturing a light-emitting element storing package having the reflector frame of the type (1), a method of manufacturing a light-emitting element storing package is provided and said method including the steps of:

forming a composition containing nitride ceramics and a compound containing an alkaline earth metal, and sintering the formed product in a weak reducing atmosphere thereby to thereby obtain a reflector frame composed of white nitride ceramics.

Furthermore, in this invention, as for a method for effectively manufacturing a light-emitting element storing package having the reflector frame of the type (2), a method of manufacturing a light-emitting element storing package is provided and said method including the steps of:

sintering nitride ceramics and thereafter oxidizing the sintered compact in an oxygen atmosphere to thereby obtain a reflector frame, which is composed of nitride ceramics and has a light-reflecting surface consisting of an oxide layer formed on its surface.

Moreover, in this invention, as for a method for effectively manufacturing a light-emitting element storing package having the reflector frame of the type (3), a method of manufacturing a light-emitting element storing package is provided and said method including the steps of:

forming a composition containing a compound including nitride ceramics into the shape of a reflector frame, applying a composition containing white ceramics onto the surface which is a light-reflecting surface of the formed product obtained by said forming process, and sintering the formed product which is applied by the composition containing white ceramics thereby obtain a reflector frame having a light-reflecting surface.

In addition, in this invention, as for another method for effectively manufacturing a light-emitting element storing package having the reflector frame of the type (3), a method of manufacturing a light-emitting element storing package is provided and said method including the steps of:

preparing a preform for a light-emitting element storing package having a reflector frame composed of nitride ceramics, applying a nitride ceramics paste on the surface to be a light reflecting surface of the reflector frame of the preform which is prepared by said preparing process, and calcining the preform, on which surface the nitride ceramics paste is applied in said applying process, in an atmosphere containing a reducing gas, and in said calcining process, the calcining process is performed under the condition that in the sintered product, which is obtained by sintering the nitride ceramics paste, voids having a diameter of 0.1 μm or larger are remained.

In the light-emitting element storing package according to this invention, the light-reflecting surface of the reflector frame is consisting of white ceramics having a high reflectance of light. As a result, light emitted from the light-emitting element can be efficiently and steadily reflected by the reflector frame and therefore the brightness of the light-emitting element can be improved.

Furthermore, in the package of this invention, there is no requirement that a metallic light-reflecting layer is provided on the inner wall surface of the reflector frame as conventional technique. Therefore, the wiring pattern layer, which is formed on the bottom surface of the light-emitting element storing concave portion, is not short-circuited, so that the light emitting function of the light-emitting element is not prevented.

Moreover, in this invention, the inner wall surface of the reflector frame in the light-emitting element storing concave portion and whole surface of the insulating substrate having a board configuration composed of ceramics excluding the surface on which the wiring pattern layer is formed can be as a light reflecting surface. Consequently, efficiency of light reflectivity is enhanced.

As the reflector frame is composed of nitride ceramics of high thermal conductivity, the heat generated by the light-emitting element is not accumulated in the light-emitting element storing package and the heat is dissipated through the reflector frame. As a result, there is no possibility that the light-emitting element is damaged by heat.

Specifically, if the insulating substrate is composed of nitride ceramics, heat radiation is efficiently accomplished through the insulating substrate. Therefore, the damaging of the element by heat can be more effectively prevented.

Figure 1:
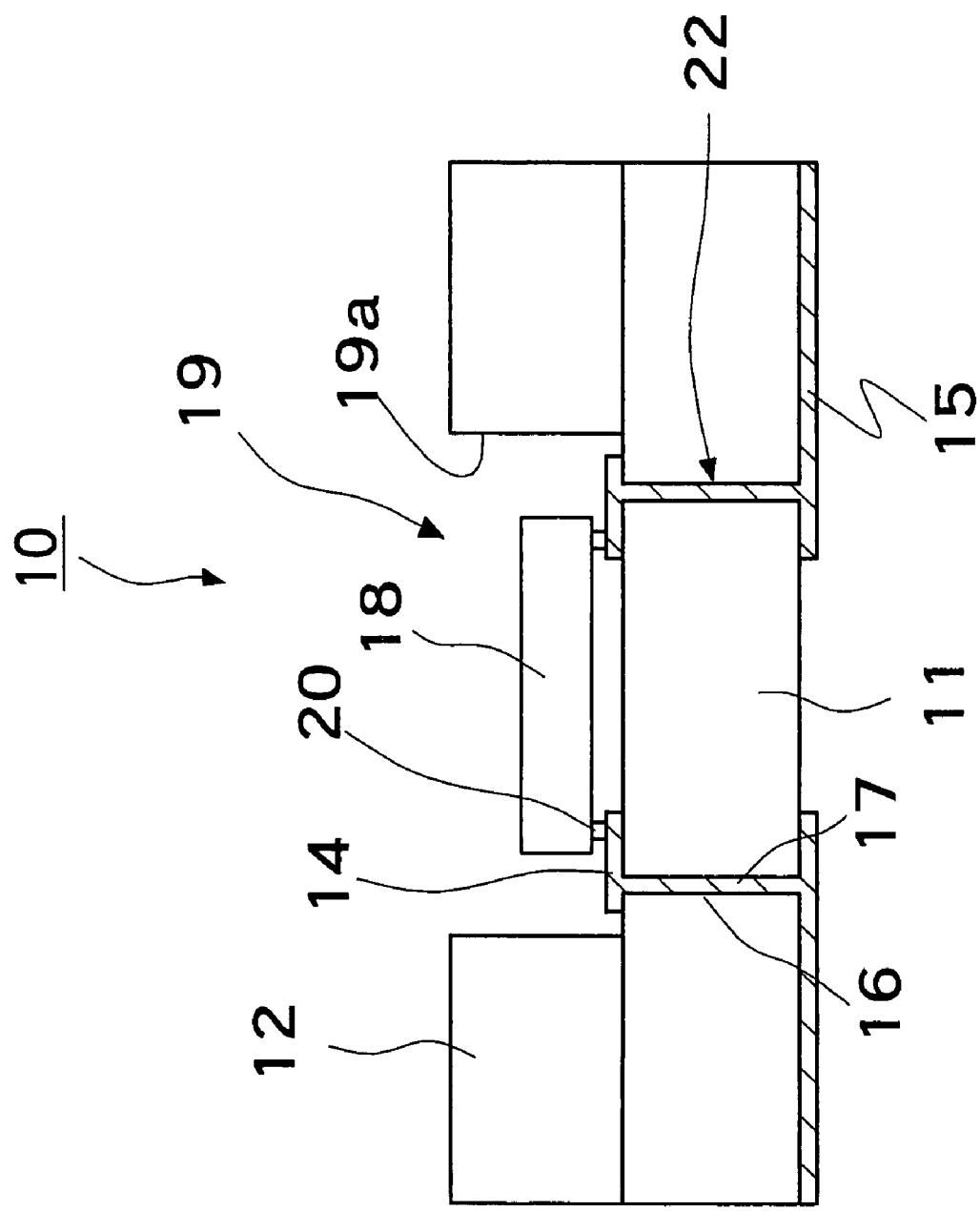
FIG. 1 is a sectional view showing the embodiment of the light-emitting element storing package of this invention.

EXPLANATION OF THE NUMERALS 10 light-emitting element storing package
11 insulating substrate
12 reflector frame
13 light-reflecting surface
13a light-reflecting layer
14 wiring patterns
15 wiring patterns
16 wiring through-hole
17 electrically conductive member
18 light-emitting element
19 light-emitting element storing concave portion
20 bump electrode
22 electrically conducting portion

DETAILED DESCRIPTION OF THE INVENTION

Description will now be made of several forms of light-emitting element storing packages embodying this invention with reference to the drawings.

FIG. 1 is a sectional view showing the embodiment of the light-emitting element storing package of this invention.

In FIG. 1, the light-emitting element storing package of this invention is shown at 10 as a whole.

The light-emitting element storing package 10 has an insulating substrate 11 of a ceramic material in the form of a substantially square flat board and a reflector frame 12 of a ceramic material joined to the upper surface of the substrate 11 along its outer edge.

The substrate 11 and the reflector frame 12 define in their center a light-emitting element storing concave portion 19 for storing a light-emitting element 18.

Thus, the substrate 11 serves as a support for the light-emitting element 18 and has above its upper surface the concave portion 19 for storing the light-emitting element 18.

Moreover, as shown in FIG. 1, a feed wiring pattern layer 15 adapted for electrical connection to e.g. a circuit board (not shown) is formed on the lower surface of the substrate 11.

On the upper surface of the substrate 11, a light-emitting element connecting wiring pattern layer 14, which extends from its outer edge to a light-emitting element storing concave portion 19, is formed.

In the substrate 11 under the light-emitting element storing concave portion 19, a wiring through-hole 16, which is penetrated between the upper and lower surfaces of the substrate 11, is formed. The wiring through-hole 16 is filled with an electrically conductive member 17 to form an electrically conducting portion 22.

As a result, the light-emitting element connecting wiring pattern layer 14 and the feed wiring pattern layer 15 are electrically connected to each other by means of this electrically conducting portion 22.

Thus, an electrically conducting path is defined from the feed wiring pattern layer 15 to the light-emitting element connecting wiring pattern layer 14 through the electrically conducting portion 22.

In addition, in the light-emitting element storing concave portion 19 inside of the light-emitting element storing concave portion 19, the light-emitting element 18, such as a light-emitting diode, is electrically connected to (or mounted on) the light-emitting element connecting wiring pattern layer 14 through the bump electrode 20 by means of, for example, ultrasonic welding.

In this case, as for the electrically conductive member 17, a metal paste prepared from a metal powder, such as tungsten or molybdenum, etc. is utilized and this metal paste is filled into the wiring through-hole 16 by means of, for example, printing and press fitting. Thereafter, calcination is performed and then the exposed end surface of the metal paste is plated with nickel or gold so that the electrically conducting portion 22 is formed.

On the other hand, as for the materials consisting of the light-emitting element connecting wiring pattern layer 14 and the feed wiring pattern layer 15, the same materials as the electrically conductive member 17 can be used.

Moreover, if a metal of high corrosion resistance, such as nickel or gold and the like is formed on the surface of the light-emitting element connecting wiring pattern layer 14, the oxidation and corrosion of the electrically conductive member 17 can be effectively prevented.

Furthermore, in this case, the connection between the light-emitting element connecting wiring pattern layer 14 and the light-emitting element 18 can be strengthened.

Accordingly, on the surface of the light-emitting element connecting wiring pattern layer 14, nickel and gold plating layers are generally formed one by one by the electrolytic plating method or the electroless plating method.

Furthermore, the reflector frame 12 has a substantially circular or square through-hole 19a formed in its center for storing the light-emitting element 18. As a result, by this through-hole 19a, the light-emitting element storing concave portion 19 is formed between the substrate 11 and the reflector frame 12.

In this case, the configuration of the through-hole 19a is not limited. However, it is preferable that the configuration of the through-hole 19a is substantially circular. The reason is that a light emitted from the light-emitting element 18, which is stored in the through-hole 19a, can be reflected uniformly in every direction and emitted outside uniformly by the inner wall surface (or light-reflecting surface) of the substantially circular through-hole 19a.

In addition, the reflector frame 12 is consisting of the same material as the substrate 11, or is consisting of a different material, and is joined to the upper surface of the substrate 11 integrally therewith by sintering.

Figure 2:
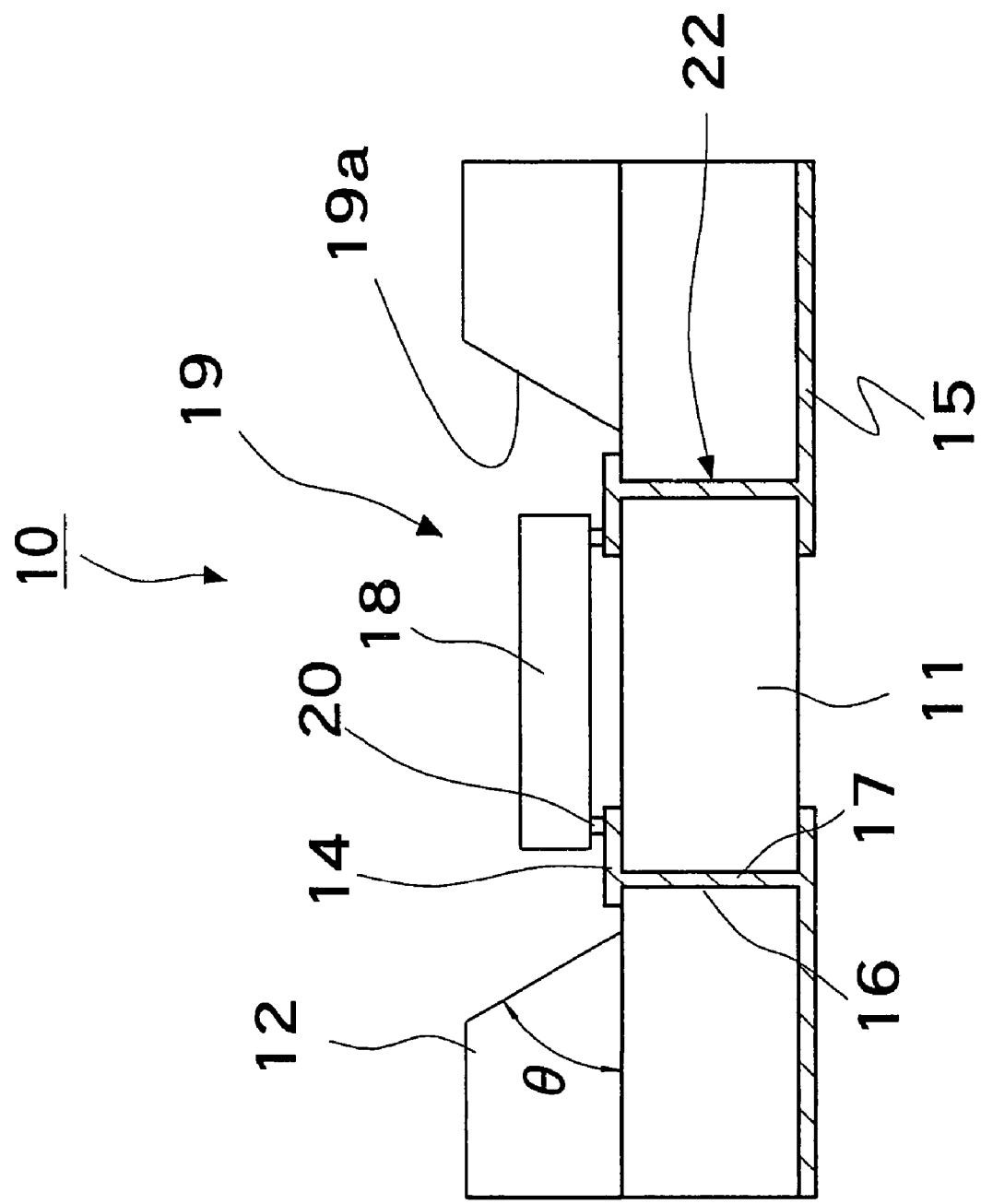
FIG. 2 is a sectional view showing another embodiment of the light-emitting element storing package of this invention.

Moreover, as shown in FIG. 2, in order to emit outside the light emitted by the light-emitting element 18 uniformly and effectively, it is preferable that an angle of the inner wall surface (or light-reflecting surface) of the reflector frame 12 is appropriately changed so that the light is reflected in accordance with the using situation.

That is to say, it is preferable that the inner wall surface of the reflector frame 12 is formed as an inwardly inclined tapered surface.

More specifically, it is preferable that an angle $\theta$ between the inner tapered surface of the reflector frame 12 and the light-emitting element connecting wiring pattern layer 14 is of 45 to 75 degrees, in order to reflect the light emitted by the light-emitting element 18 outward effectively.

As the degree of reflection of the light emitted by the light-emitting element 18 depends on the place or purpose of its use, an appropriate adjustment of the angle $\theta$ depending on the situation of its use provides a proper package for storing the light-emitting element.

When the light-emitting element storing package 10 according to this invention as described is used, the light-emitting element 18 is mounted and electrically connected on the light-emitting element connecting wiring pattern layer 14 inside of the light-emitting element storing concave portion 19 in the substrate 11, for example through the bump electrode 20.

Thereafter, the light-emitting element storing concave portion 19 storing the light-emitting element 18 is sealed by filling with a transparent resin, such as an epoxy or silicone resin and the like. Furthermore, while sealing, a fluorescent material, etc. is disposed or added into the sealing resin and thereafter such as lens and the like is installed on the sealing resin so that the light-emitting device is fabricated.

In the above embodiment, an electrical connection between the light-emitting element and the connecting wiring pattern layer 14 the light-emitting element 18 may be made by, for example, ultrasonically welding the bump electrode to the light-emitting element, placing the element to connect its wiring side down and connecting it with the wiring pattern layer.

In addition, the electrical connection also may be made by, for example, bonding the light-emitting element 18 to the substrate 11 with an adhesive and then connecting each terminal of the light-emitting element 18 with the light-emitting element connecting wiring pattern layer 14, which is formed on the upper surface of the substrate 11, through a bonding wire, such as a gold wire and the like.

Furthermore, when the light-emitting element storing package 10 is connected to another circuit board having a electrode or electrodes, a feed electrode or electrodes corresponding to the electrode(s) can be formed on the lower surface of the feed wiring pattern layer 15 and then the formed feed electrode(s) is electrically connected with the electrode(s) of the circuit board.

In the above case, an insulating layer can be formed on the remaining portion, on which the feed electrode of the feed wiring pattern layer is not provided.

In the light-emitting element storing package 10 as described, the reflector frame 12 is composed of white nitride ceramics. Accordingly, all surface of the reflector frame 12, including its light-reflecting surface, is consisting of white nitride ceramics.

As the light reflectance of this white nitride ceramics is high and the light emitted from the light-emitting element can be reflected by the reflector frame 12 itself, the light can be reflected steadily and effectively reflected by the reflector frame 12 so that its brightness can be improved.

Therefore, it is no longer necessary to form any special light-reflecting layer on the inner wall surface of the reflector frame 12. Therefore, the wiring pattern layer 14, which is formed on the bottom of the light-emitting element storing concave portion 19, is not short-circuited so that the light-emitting function of the light-emitting element 18 is not prevented.

In addition, as the reflector frame 12 is composed of the white nitride ceramics having a relatively high thermal conductivity, the heat from the light-emitting element 18 is not accumulated in the light-emitting element storing package 10. As a result, the heat is emitted outside through the reflector frame 12 so that there is no possibility the light-emitting element 18 is damaged.

Description will now be made in detail of the white nitride ceramics constituting the reflector frame 12.

In the light-emitting element storing package 10, the reflector frame 12 has not only the function that its brightness is improved by effectively reflecting the light from the light-emitting element, but also has the function that heat generated by the light-emitting element is released outside.

Therefore, as for the white nitride ceramics constituting the reflector frame 12, it is preferable that a material, which is high in both light reflectance and thermal conductivity, is used.

As for the white nitride ceramics constituting the reflector frame 12, any nitride ceramics having a white color in appearance can be used without any particular limitation. That is to say, for example, known nitride ceramics, such as aluminum nitride ceramics, silicon nitride ceramics and boron nitride ceramics and the like can be utilized.

In this case, it is desirable from the standpoint of light reflectance that a material, which has a reflectance of 50% or more for light having a wavelength of 350 to 800 nm, is used.

If the light reflectance of the white nitride ceramics constituting the reflector frame 12 falls within that range, it can reflect the light of the light-emitting element efficiently to the light output side and thereby improve its brightness.

In addition, such white nitride ceramics desirably have a reflectance of 55% or more for light having a wavelength of 400 nm. Therefore, as their reflectance of light having a wavelength of 400 nm is high, for example, where a blue light-emitting element for a white LED is used as the light-emitting element 18, the light emitted from the light-emitting element is effectively reflected so that its brightness can be improved.

Furthermore, in view of a thermal conductivity, such white nitride ceramics desirably have a thermal conductivity of 140 (W/m·K) or more. If the thermal conductivity of the white nitride ceramics constituting the reflector frame 12 falls within that range, the heat from the light-emitting element 18 is not accumulated in the light-emitting element storing package 10.

As a result, the heat is emitted outside through the reflector frame 12 so that the possibility the light-emitting element 18 is damaged become low.

In view of the light reflecting property, the heat conductive property and the mechanical property described above, as for the white nitride ceramics constituting the reflector frame 12, it is most preferable that aluminum nitride ceramics, which has a thermal conductivity of 140 (W/m·K) or more, which has a reflectance of 50% or more for light having a wavelength of 350 to 800 nm, which has a reflectance of 55% or more for light having a wavelength of 400 nm and which has a density of 3.10 g/cm$^3$ or more, is utilized.

Description will now be made in detail of the case in which aluminum nitride ceramics as stated above are used as the white nitride ceramics.

In order to emit outside the heat generated from the light-emitting element 18 through the reflector frame 12 without accumulating the heat in the light-emitting element storing package 10, it is necessary that the reflector frame 12 is constituted from an insulating material having a high thermal conductivity and a high light reflectance.

However, such insulating material satisfying such requirements has not been known until now. As for the insulating material having high thermal conductivity, for example, a sintered compact of aluminum nitride is known. However, the known sintered compact of aluminum nitride has a problem in light reflectance, since its color tone is gray with translucency.

Therefore, we, the inventors of this invention, have made an intensive study since we thought that the above problem could be solved by whitening the sintered compact of aluminum nitride.

As a result, we have been able to obtain a sintered compact of aluminum nitride having a white color and a high thermal conductivity by using a specific sintering assistant and controlling the sintering atmosphere.

That is to say, the obtained sintered compact of aluminum nitride is an aluminum nitride ceramics, of which a thermal conductivity is 140 (W/m·K) or more, of which reflectance is 50% or more for light having a wavelength of 350 to 800 nm, of which reflectance is 55% or more for light having a wavelength of 400 nm, and of which density is 3.10 g/cm$^3$ or more.

In addition, as the theoretical density of aluminum nitride is 3.26 g/cm$^3$, the density of 3.10 g/cm$^3$ is equivalent to about 95% of the theoretical density of aluminum nitride.

In this case, as for the aluminum nitride ceramics used in this invention, it means that ceramics consisting of aluminum nitride or ceramics consisting of aluminum nitride as a main component.

Moreover, where aluminum nitride is main component of the ceramics, it is preferable that, in view of the thermal conductivity, the content of the aluminum nitride is 95% or more, and more desirably 97% or more, by mass.

In addition, in this case, as for the content other than aluminum nitride, for example, a sintering additive (a sintering aids) such as an alkaline earth metal or rare earth metal oxide, and other ceramics such as alumina can be exemplified.

Moreover, as for the aluminum nitride ceramics which are suitable for use in accordance with this invention, monocrystalline, polycrystalline or amorphous form, and an amorphous and crystalline mixture form is available. In this case, a polycrystalline form is desirable for ease of manufacture.

The thermal conductivity of the aluminum nitride ceramics used in accordance with this invention, their reflectance of light having a wavelength of 350 to 800 nm and their density can be determined by the methods which will now be described.

Their thermal conductivity can be determined by the laser-flash method using a thermal constant determining device. In this determination, correction by thickness may be made by preparing a working curve.

In addition, their reflectance of light having a wavelength of 350 to 800 nm can be determined by the integrating sphere method using a spectrophotometer. Moreover, their density can be determined by the Archimedian method using an automatic gravimeter and an electronic even balance.

The aluminum nitride ceramics used in accordance with this invention can be obtained by employing a specific sintering additive (aid) and a specific sintering condition when sintering a powder of aluminum nitride.

More specifically, they can be manufactured by the process which will now be described.

Firstly, a formed product is first prepared by forming a composition containing 100 parts by mass of a powder of aluminum nitride and 0.5 to 10 parts by mass of a compound containing an alkaline earth metal (step of preparing a formed product).

In this case, as for the powder of aluminum nitride, any conventional powder which is used in obtaining a sintered compact of aluminum nitride can be used without any limitation.

However, it is desirable that, in order to obtain a dense sintered compact, a powder having an average particle diameter of 0.5 to 5 µm, particularly 0.5 to 3 µm is used. Furthermore, it is desirable that, in order to obtain a sintered compact of high thermal conductivity, a powder having an oxygen content of 1.0% by weight or less is used.

In addition, the compound containing an alkaline earth metal functions as a sintering additive (aids). In case that any sintering additive (aids) other than such a compound is used, it is difficult to obtain aluminum nitride ceramics having the properties as stated above. In this case, as for the compound containing an alkaline earth metal, it is desirable that, in view of its high effectiveness, a compound containing calcium is used.

As for such compounds containing alkaline earth metals, where the desirable compounds is exemplified, calcium oxide, calcium fluoride, calcium nitrate, calcium carbonate, calcium phosphate and 3CaO.Al$_2$O$_3$ can be utilized. Among these compounds, in order to obtain a product having high thermal conductivity and light reflectance, it is most desirable that 3CaO.Al$_2$O$_3$ is used.

Moreover, for same reasons, the content of the compound containing an alkaline earth metal is desirably from 1 to 7 parts by mass for 100 parts by mass of powder of aluminum nitride. In addition, as for the compound containing an alkaline earth metal, by the reason that white aluminum nitride ceramics having higher quality can be obtained, it is desirable that a fine powder having a purity of 99.9% or more is used.

By the way, if 3CaO.Al$_2$O$_3$ is used as the compound containing an alkaline earth metal, 3CaO.Al$_2$O$_3$ may be added as its state. Alternatively, in this case, CaO and Al$_2$O$_3$ may be added in a mole ratio of 3:1 to give a predetermined amount of 3CaO.Al$_2$O$_3$ at the time of sintering.

In addition, it is generally known that when a sintering additive (aids), such as yttrium oxide, is added to aluminum nitride, aluminum nitride, oxygen as its impurity, yttrium oxide, etc. react to form a composite compound having a lower melting point than the sintering temperature, and that its liquid phase affects the density of a sintered compact and an improvement in the property of the sintered compact (i.e. an improvement in its thermal conductivity).

Moreover, it is considered that, when a compound containing an alkaline earth metal, such as $3CaO \cdot Al_2O_3$, is also used as the sintering additive (aids), the compound does not exist as it is in a sintered compact, but the compound may be converted to a low-melting composite oxide, or the compound may even volatilize at the time of sintering by reacting with carbon in a sintering atmosphere.

During the step of preparing a formed product, a formed product of a composition containing 100 parts by mass of a powder of aluminum nitride and 0.5 to 10 parts by mass of a compound containing an alkaline earth metal can be obtained by mixing an appropriate amount of a powder of aluminum nitride with a powder of an alkaline earth metal, an organic binder, an organic solvent such as ethanol, a plasticizer and a dispersant by e.g. a wet mixing method using a ball mill, and forming their mixture into a sheet product by using a doctor blade.

In addition, the slurry may be dried by spray drying method so that granules are prepared and the granules are molded.

As for organic binder, any known organic binder employed usually for preparing a green body, such as polyvinyl butyral, ethyl cellulose or an acrylic resin, can be used without limitation. However, for the reason that mold ability of the green body is good, it is desirable that poly(n-butyl methacrylate) or polyvinyl butyral is used.

Furthermore, where a press molded product is obtained, the amount of the organic binder to be used is desirably from 2 to 15 parts by mass for 100 parts by mass of aluminum nitride, or when a sheet product is obtained, it is desirably from 5 to 15 parts by mass.

In addition, the degreasing of a green body is performed by heat treating it in a reducing gas such as hydrogen, an inert gas such as argon or nitrogen, carbon dioxide, or a mixture of those gases, or a wet gas atmosphere formed by adding water vapor.

Moreover, the degreasing may be performed under conditions selected from a temperature of 250° C. to 1,200° C. and a holding time of one to 1,000 minutes, depending on the kind and amount of any organic component contained in a green body.

In this degreasing, it is preferable that, by controlling the atmosphere, temperature and holding time, the amount of oxygen, which is deducted the amount of oxygen of sintering assistant from the amount of oxygen of the whole degreased object, is 1.5% by weight or less. As a result, this will make it easy to obtain a sintered compact of aluminum nitride having a thermal conductivity of 140 W/m·K or higher.

In addition, the formed product (or degreased product) after degreasing processing contains carbon as a residue from the organic binder. In this case, it is desirable that its carbon content (or concentration) is preferably lowered to 5,000 ppm or below, and more preferably to 3,500 ppm or below.

That is, where its carbon concentration exceeding 5,000 ppm, the densification of a sintered compact of aluminum nitride is extremely restricted at the time of calcinations. As a result, it is difficult to obtain a sintered compact of high thermal conductivity.

Then, the formed product prepared as described above is held in a weak reducing atmosphere and sintered.

When a compound not containing any rare earth metal, such as yttria, is used as the sintering additive (aids), if a sintering atmosphere is a reducing atmosphere (containing carbon), sinterability is lowered so that it is difficult to obtain a good sintered compact.

On the contrary, when a compound containing an alkaline earth metal, such as calcium oxide, is used as the sintering additive (aids), in order to obtain a sintered compact of aluminum nitride having a thermal conductivity as high as 230 W/m·K, it is necessary that sintering has to be performed in a relatively strongly reducing atmosphere causing the sintering assistant to volatilize or otherwise vanish (see, for example, Japanese Patent Provisional Publication No. 2004-315329).

Therefore, if a less reducing atmosphere than usual is employed when a compound containing an alkaline earth metal, such as calcium oxide, is used as the sintering additive (aids), the sintering additive (aids) is not vanished entirely by volatilization, etc.

As a result, the thermal conductivity is not as high as 230 W/m·K, but it is still possible to obtain a sintered compact having a practically fully acceptable level of thermal conductivity.

Furthermore, in view of the mechanical and physical properties, sintering property is by no means inferior. That is to say, this superiority of the sintering property is supported also from density being fully high.

Moreover, there is obtained a sintered compact having a high light reflectance not achieved by any known sintered compact of aluminum nitride.

The "weak reducing atmosphere" is an atmosphere realized by procedures as stated at (1) to (5) below.

(1) Prepare a vessel having a removable lid, having at least its inner wall consisting of boron nitride, and having a device or means which can maintain a substantially equal pressure in its interior and exterior when the lid is closed.

(2) Place a carbon sheet having a surface area of 0.024 to 24 $mm^2$ per $cm^3$ of its volume into the vessel.

(3) Purge the vessel with an inert and/or hydrogen gas.

(4) Keep the lid closed and surround the vessel by the same inert and/or hydrogen gas atmosphere as in its interior.

(5) Heat the vessel and the carbon sheet therein to a temperature of from 1,650° C. to 1,950° C., and preferably from 1,700° C. to 1,900° C. In this state, carbon volatilizes from the carbon sheet in the vessel, but the carbon sheet still remains therein.

The atmosphere produced in the vessel as described above is the "weak reducing atmosphere" and means an inert and/or hydrogen gas containing a negligible amount of carbon vapor.

It is substantially impossible by the currently available technology for analysis to determine the concentration of carbon in a very hot gas having a temperature of 1,650° C. to 1,950° C. In the context of this invention, therefore, the "weak reducing atmosphere" is identified by a specific method employed for producing it.

The "device or means which can maintain a substantially equal pressure in the interior and exterior of the vessel when the lid is closed" may, for example, be formed by fine holes connecting the interior and exterior of the vessel, or a device causing the lid to open slightly upon elevation of the pressure in its interior and close upon substantial equalization of the pressure in its interior to that in its exterior.

In addition, a carbon furnace is usually employed for sintering aluminum nitride, as it requires a high temperature. When a carbon furnace is employed, however, the sublimation of carbon from the furnace makes it difficult to control a sintering atmosphere.

According to this invention, therefore, the formed product to be sintered is heated and sintered in a special vessel as described above, i.e. a vessel having an inner surface consisting of a heat-resistant material, such as boron nitride.

When sintering is performed as described above, the surface area of the carbon sheet placed in the vessel may be so controlled as to produce an adequately controlled reducing atmosphere as a sintering atmosphere. As a result, aluminum nitride ceramics having the properties as stated before can be obtained.

In addition, the heat-resistant material means a material not melted, dissolved or subliming at a sintering temperature. As for such heat-resistant material, for example, aluminum nitride and the like can be used other than boron nitride.

Moreover, the formed product can be sintered by employing the same furnace and heating conditions as employed by any known method of making a sintered compact of aluminum nitride, except the control of the sintering atmosphere to a weak reducing atmosphere as described above.

As for this calcining temperature, it is preferable that the calcining is performed in the temperature in the range of 1,650° C. to 1,950° C. If the calcining temperature is lower than 1,650° C., a dense sintered compact can not be obtained. As a result, the strength of the sintered compact is lowered.

Moreover, if the calcining temperature is higher than 1,950° C., a liquid phase, which is formed by oxygen as impurity in aluminum nitride and a rare earth compound, is oozed out of a sintered compact at the time of calcining. As a result, it is difficult to obtain a dense sintered compact.

In addition, while the sintering time is not specifically limited, it is usually sufficient to hold the product at a temperature of 1,650° C. for one to ten hours. Furthermore, with respect to the calcining temperature and the sintering time, it is desirable to determine a densification curve (or contraction curve) for each kind of product to be sintered from the temperature range stated above. In accordance with this determination, it is desirable to select the conditions that a satisfactory level of denseness (or a density of 3.1 $g/cm^3$ or higher, and preferably 3.15 $g/cm^3$ or higher) can be obtained.

In addition, as for the calcining method, it is desirable that calcining at normal pressure is performed in view of easy atmosphere control.

On the other hand, in order to sinter the product to be sintered in a weak reducing atmosphere, it is sufficient to heat it to a sintering temperature in a reducing atmosphere as produced by using a vessel which is tightly closable as described above in connection with the "weak reducing atmosphere".

In addition, if the calcining atmosphere can be controlled to a weak reducing atmosphere, of course, any other method can be adopted. However, for the reason that atmosphere control is easily performed even in case of using a carbon furnace, it is desirable to utilize the above method.

Moreover, as for the vessel using in used in the above method, if the above-mentioned requirements are satisfied, the vessel is not particularly limited. For example, the vessel, which is defined by the weak reduction atmosphere, can be used.

In addition, in this case, wording "tightly closable" means that there is airtightness of the grade which can maintain the inside atmosphere of the vessel to the state different from the atmosphere outside of the vessel.

Therefore, it does not mean that the movement of gas between inside and outside of the vessel is obstructed entirely.

Moreover, it is also sufficient for the vessel to have at least its inner surface consisting of a heat-resistant material, such as boron or aluminum nitride. For example, a vessel made of carbon and having an inner surface lined with any such heat-resistant material can be suitable for use.

In addition, as for the inert gas and/or hydrogen gas, nitrogen, argon, helium or hydrogen gas, or a mixture thereof can be used. In this case, in view of cost and easy handling, it is desirable that nitrogen is used.

Furthermore, as for a carbon board accommodated in the vessel, a graphite board or a sheet can be suitably used. The thickness of the graphite board is not specifically, but it is desirable that a board having a thickness of 0.1 to 5 mm is used.

In addition, with respect to the size of the carbon board to be used, in view of the effect, it is desirable that a surface area thereof is from 0.05 to 10 $mm^2$ and is more preferably from 1.0 to 5.0 $mm^2$ per $cm^3$ of the volume of the vessel.

The aluminum nitride ceramics produced as described above has a high thermal conductivity, a high light reflectance and a high mechanical strength, so that it can be suitably used as the reflector frame 12 of the light-emitting element storing package 10.

Description will now be made of a process for manufacturing a light-emitting element storing package 10 according to this invention as described above.

FIGS. 3A to 3D are a series of sectional views showing step by step a process for manufacturing a light-emitting element storing package as shown in FIG. 1.

Figure 3:
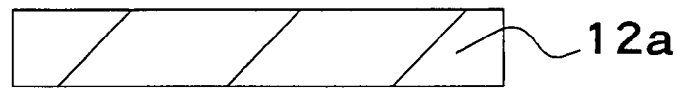
FIG. 3 is a sectional view for every process for explaining the manufacture method of this invention for manufacturing the light-emitting element storing package of this invention.
Figure 3:
Figure 3:
Figure 3:
Figure 3:
Figure 3:
Figure 3:
Figure 3:
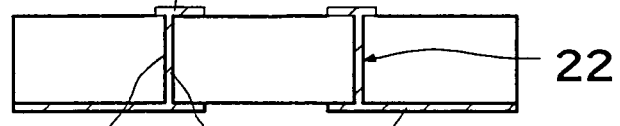
Figure 3:
Figure 3:
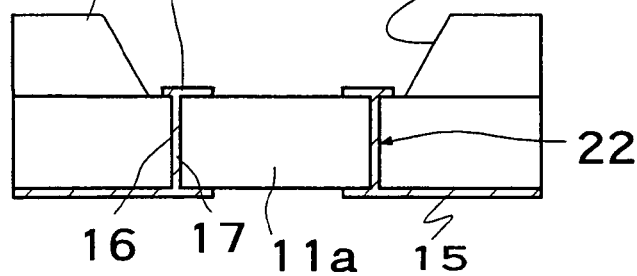

Firstly, as shown in FIG. 3A, a green ceramic sheet 11a used as the basis of an insulating substrate 11 and a green ceramic sheet 12a used as the basis of a reflector frame 12 are prepared.

As for the green ceramic sheets 11a and 12a, aluminum nitride ceramics explained above as white nitride ceramics may be used.

Thereafter, as shown in FIG. 3B, to the green ceramic sheet 11a used as the basis of an insulating substrate 11, at the position corresponding to the lower part of a light-emitting element storing concave portion 19, a wiring through-hole 16 is punched by a punching die. As a result, a wiring through-hole 16, which extends from the upper surface to the lower surface of the insulating substrate 11, is formed.

Furthermore, to the green ceramic sheet 12a used as the basis of a reflector frame 12, a through-hole 19a for light-emitting element storing concave portion 19 is punched by a punching die.

At this time, as shown in FIG. 3B, the inner wall of the through-hole 19a formed in ceramic green sheet 12a for reflector frame 12 forms so that it may become a taper surface from one side to the another side of ceramic green sheet 12a.

Thus, the inner wall of the through-hole 19a is so formed that it may spread at a fixed angle towards from one principal surface to another principal surface of the green ceramic sheet 12a. As a result, the inner wall of the through-hole 19a of the reflector frame 12 can be formed so that it may spread outside at a fixed angle to the upper surface of the insulating substrate 11.

Then, as shown in FIG. 3C, an electrically conductive paste for an electrically conductive member 17 is applied to the upper and lower surfaces of the green ceramic sheet 11a for the substrate 11 and is filled in the wiring through-hole 16, by, for example, pressing or screen printing. As a result, an electrically conducting portion 22 is formed.

Moreover, on the lower surface of the substrate 11, a feed wiring pattern layer 15 for electrical connection such as a circuit board (not shown) is formed and on the upper surface of the substrate 11, a light-emitting element connecting wiring pattern layer 14, which is extending from its outer edge to the light-emitting element storing concave portion 19 is formed, respectively by printing and applying on the required wiring pattern by using such as screen printing.

As for the materials constituting the light-emitting element connecting wiring pattern layer 14 and the feed wiring pattern layer 15, same material as the electrically conductive member 17 can be used.

In this case, as for a method of forming the light-emitting element connecting wiring pattern layer 14 and the feed wiring pattern layer 15, it is not particularly limited. However, the following well known pattern-forming method can be adopted, for example:

(i) a method in which a pattern is printed on the insulating substrate with a high-melting point metal, such as tungsten and is simultaneously calcinated to plate with nickel, silver or gold thereon; or (ii) a method in which a high-melting point metal layer is likewise formed on the substrate by simultaneous calcining, and a metal film pattern is formed thereon by sputtering.

Thereafter, as shown in FIG. 3D, on the upper surface of the green ceramic sheet 11a for the substrate 11, the green ceramic sheet 12a for the reflector frame 12 is bonded to form a green body in such a way that the inner wall of the through-hole 19a may spread outwardly to the upper surface of the green ceramic sheet 11a.

Such bonding is performed by the following method, since the green ceramic sheets 11a and 12a contain an organic binder and an adhesive material containing a solvent, as stated above. That is, a method, in which the green ceramic sheet 12a is superposed on the upper surface of the green ceramic sheet 11a and they are stuck by pressure of about 10 to 100 Kpa under heating at a temperature of about 60° C. to 140° C. are utilized.

In addition, an organic binder and/or an adhesive containing a solvent separately may be applied to the lower surface of the green ceramic sheet 12a.

Then, after degreasing the green body formed in this way, the laminated green ceramic sheets 11a and 12a and the electrically conductive paste applied thereto are calcinated at a high temperature. As a result, a sintered compact having the insulating substrate 11 and the reflector frame 12 joined integrally together by calcinating is obtained.

In this case, in order not to oxidize metal, such as tungsten, degreasing of a green body is performed by heat-treating a green body in a reducing gas such as hydrogen, an inert gas such as argon or nitrogen, carbon dioxide, or a mixture of those gases, or a wet gas atmosphere formed by adding water vapor.

Moreover, in accordance with the kind and amount of an organic component contained in the green body, the degreasing may be performed under conditions selected from a temperature of 250° C. to 1,200° C. and a holding time of one to 1,000 minutes.

Then, the molded product is sintered at a temperature of from 1,650° C. to 1,950° C. and preferably from 1,700° C. to 1,900° C. in a weak reducing atmosphere.

After this sintering, on the electrically conductive portions of the sintered compact, i.e. on the exposed surfaces of the light-emitting element connecting wiring pattern layer 14 and the feed wiring pattern layer 15, a plating metal layer such as nickel, platinum, palladium, rhodium, silver, etc. is appropriately formed by electroplating or electroless plating. As a result, a light-emitting element storing package as shown in FIG. 1 (FIG. 2) is completed.

Figure 4:
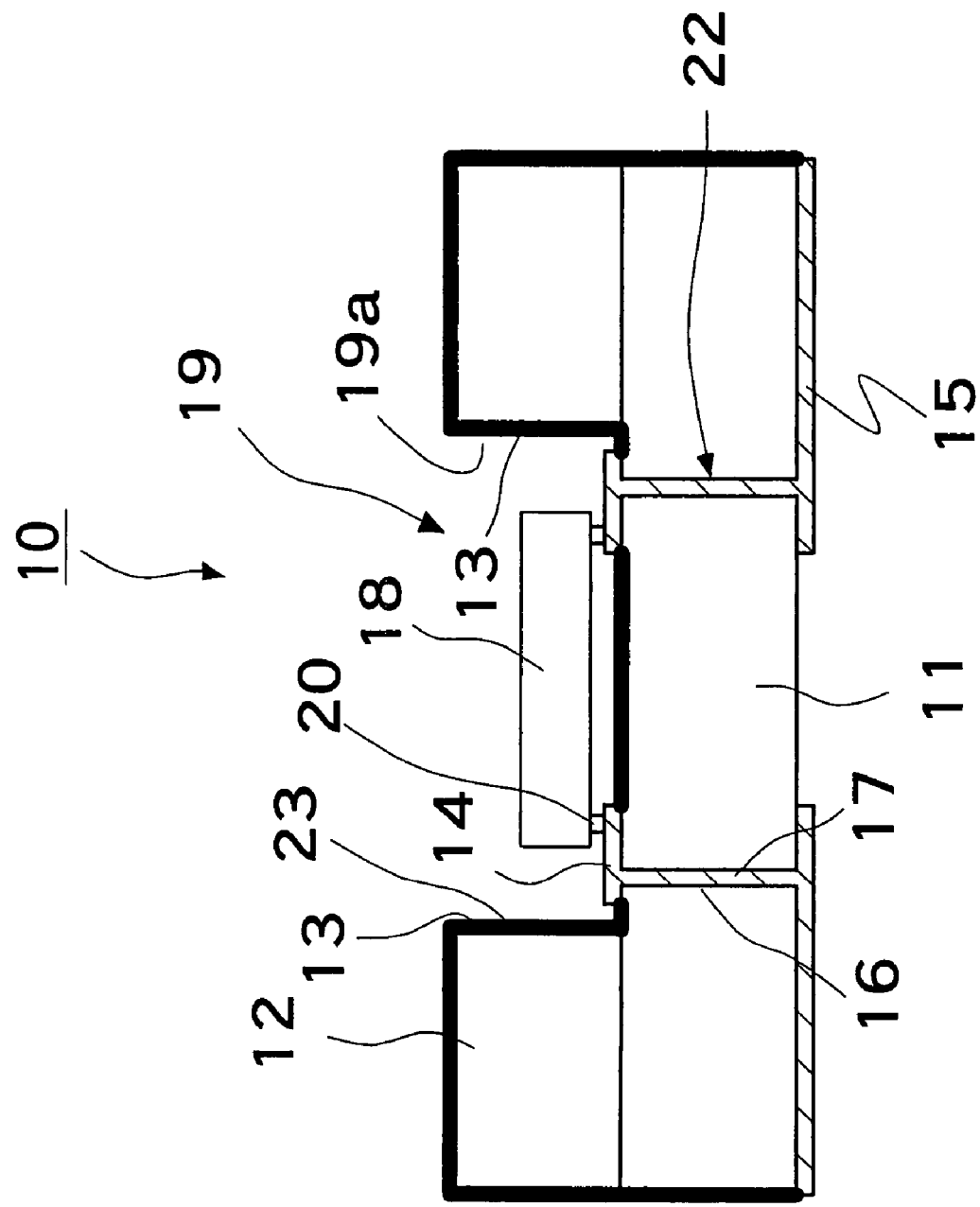
FIG. 4 is a sectional view showing another embodiment of the light-emitting element storing package of this invention.

FIG. 4 is a sectional view showing another embodiment of the light-emitting element storing package of this invention.

The light-emitting element storing package 10 of this embodiment shown in FIG. 4 is basically identical in construction to those shown in FIGS. 1 and 2 and like reference numerals are used to denote like parts or members in all of these drawings.

In the light-emitting element storing package 10 of this embodiment, as shown in FIG. 4, the reflector frame 12 is composed of nitride ceramics. Moreover, on its surface, i.e. on the inner side surface (light-reflecting surface), a light-reflecting surface 13 consisting of an oxide which is formed by oxidation treatment.

This light-reflecting surface 13 consisting of the oxide obtained by the oxidation of nitride ceramics has a high light reflectance. Therefore, in this construction, the reflector frame 12 is composed of nitride ceramics and a light-reflecting surface 13 consisting of an oxide formed by the oxidation treatment is provided. As a result, the light emitted from the light-emitting element can be efficiently and steadily reflected and the brightness of the light-emitting element can be improved.

In addition, "the oxide formed by the oxidation treatment of nitride ceramics" constituting the light-reflecting surface 13 is electrically insulating. Therefore, even if such oxide layer is formed over the whole inner side surface of the light-emitting element storing concave portion 19, the wiring pattern layer 14, which is formed on the bottom surface of the light-emitting element storing concave portion 19, will not be short-circuited. As a result, the light emitting function of the light-emitting element 18 is not obstructed.

Moreover, since such oxide layer 23 is formed over the whole inner side surface of the light-emitting element storing concave portion 19, the reflective efficiency of the light by the reflector frame 12, which is emitted from the light-emitting element 18, can be improved.

Moreover, the nitride ceramics constituting the main material of the reflector frame 12 has a relatively high thermal conductivity and the oxide layer 23 obtained by the oxidation of nitride ceramics is thin. Accordingly, the heat emitted from the light-emitting element 18 is not accumulated in the light-emitting element storing package 10 and the heat is emitted outside through the reflector frame 12, so that the light-emitting element 18 is not damaged by the heat.

Description will now be made in further detail of the oxide layer 23 formed on the surface of the reflector frame 12.

In this case, it is desirable that the oxide layer 23 has a reflectance of 60% or more for light having a wavelength of 350 to 800 nm. If it has such a reflectance, on the light-reflecting surface 13 formed by the oxide layer 23, the light emitted from the light-emitting element 18 can be effectively reflected toward the light output surface side, so that its brightness can be improved.

In addition, it is desirable that the oxide layer 23 has a reflectance of 80% or more for light having a wavelength of 400 nm. In this way, the reflectance for light having a wavelength of 400 nm is high. Therefore, for example, if a blue light-emitting element for a white LED is used as the light-emitting element 18, on the light-reflecting surface 13 formed by the oxide layer 23, the light emitted from the light-emitting element 18 can be effectively reflected, so that its brightness can be improved.

In order to obtain such oxide layer 23, more specifically, after sintering the nitride ceramics, an oxidization processing may be carried out under oxygen atmosphere.

Thus, by carrying out the oxidization processing under oxygen atmosphere, after sintering the nitride ceramics, an oxide layer, such as an aluminum oxide layer, will be formed on the surface of a nitride ceramics sintered compact. As a result, the light-reflecting surface 13 consisting of the oxide layer 23, which has a good light reflectance, an electrical insulating property and a relatively high thermal conductivity, can be formed on the surface of the reflector frame 12.

In this case, as for the nitride ceramics, for example, aluminum nitride ceramics can be used suitably. In this case, to a powder of such ceramic material, an organic solvent such as alcohol or toluene, a suitable organic binder, a plasticizer such as a glycerol compound, a dispersant, etc. are added, so that a slurry is prepared. Furthermore, this slurry is formed into a sheet having an appropriate thickness by sheet-forming technology, such as a method using a doctor blade.

In addition, as for the organic binder, it is possible to use any known binder employed usually in preparing a green sheet, such as polyvinyl butyral, ethyl cellulose or an acrylic resin. In this case, since moldability of a green sheet is good, it is suitable to use poly(n-butyl methacrylate) or polyvinyl butyral, etc.

In this case, in order not to oxidize metal, such as tungsten, the degreasing of the green body is performed by heat treating the green body, in a reducing gas such as hydrogen, an inert gas such as argon or nitrogen, carbon dioxide, or a mixture of those gases, or a wet gas atmosphere formed by adding water vapor.

Moreover, in accordance with the kind and amount of the organic component contained in the green body, the degreasing may be performed under conditions selected from a temperature of 250° C. to 1,200° C. and a holding time of one to 1,000 minutes.

As for the condition of the sintering, calcining may be performed under the conditions including a temperature of from 1,600° C. to 2,000° C. and preferably from 1,750° C. to 1,850° C. and a calcining time of from one to 20 hours and preferably from 2 to 10 hours. As for the atmosphere of this sintering, sintering may be performed in a non-oxidizing gas atmosphere at a normal pressure.

Moreover, after sintering is performed in this way, the sintered compact is oxidized in an oxygen atmosphere so that an oxide layer 23 is formed on the surface of the nitride ceramics sintered compact. In this case, oxidation in an oxygen atmosphere may be performed in an atmosphere containing 10 to 100% by volume of oxygen gas and preferably in the open air.

In addition, as for the condition of the oxidation, the calcining may be performed at a temperature of from 800° C. to 1,500° C. or preferably from 1,200° C. to 1,400° C. and a calcining time of from 5 to 100 hours, or preferably 10 to 20 hours. More suitably, it is desirable that nitride ceramics is oxidized at a temperature of 1,200° C. for 5 hours or more to form an oxide layer.

By performing the oxidation under such conditions, the underlying nitride ceramics (e.g. aluminum nitride) is converted into an oxide (e.g. aluminum oxide) having a high density, a high light reflectance and a relatively high thermal conductivity, so that an oxide layer 23 constituting of such oxide can be obtained.

As for the thickness of the oxide formed by this oxidation, it is desirable that the thickness is from 5 to 1,000 μm, or more preferably from 10 to 500 μm, in view of reflectance and mechanical strength.

In addition, it is also possible that, after sintering the nitride ceramics, the sintered compact is heated to, for example, 1,200° C. in a nitrogen atmosphere and thereafter is oxidized by changing the atmosphere to an oxygen atmosphere at the same temperature. As a result, an oxide layer 23, which has higher density, hardness and improved mechanical strength, can be formed.

The light-emitting element storing package 10 of this invention package 10 as described above can be manufactured by a process similar to the process used for manufacturing the package shown in FIG. 2, and shown in FIGS. 3A to 3D.

That is to say, substantially the same steps can be employed until the degreasing and calcining of a green body.

Then, after this calcination process is completed, oxidation treatment may be performed. If the oxidation treatment is performed, for example, the light-emitting element connecting wiring pattern layer 14 and the feed wiring pattern layer 15 are also oxidized, so that it becomes difficult to plate nickel, silver, and gold thereon.

Therefore, it is suitable that, before the oxidation treatment, on the surfaces of the light-emitting element connecting wiring pattern layer 14 and the feed wiring pattern layer 15, a noble metal, such as gold or platinum are formed by using plating method or vapor deposition method and thereafter the oxidation treatment is performed.

Instead of forming such a noble metal layer before oxidation treatment, the following processes can be adopted. Namely, the oxidation treatment is firstly performed and thereafter the light-emitting element connecting wiring pattern layer 14 and the feed wiring pattern layer 15 are treated by etching so that oxide films are removed from the wiring pattern layers 14 and 15. Then, the surface of the wiring pattern layers 14 and 15 are plated with gold, etc.

Thus, light-emitting element storing package is completed by performing oxidization treatment and plating treatment.

In addition, in this embodiment, after calcining, the oxidation treatment is performed without specifically using a masking, etc. Therefore, all of the exposed surfaces of nitride ceramics are oxidized, so that the surfaces other than inner side surface of the reflector frame 12 and the bottom surface of the light-emitting element storing concave portion 19 of the substrate 11 (these surface define the light-reflecting surfaces) have the oxide layer 23.

In this case, if the oxide layer would not be formed on the surface other than the light-reflecting surfaces, the oxidation treatment may be performed with masking all such portions.

Figure 5:
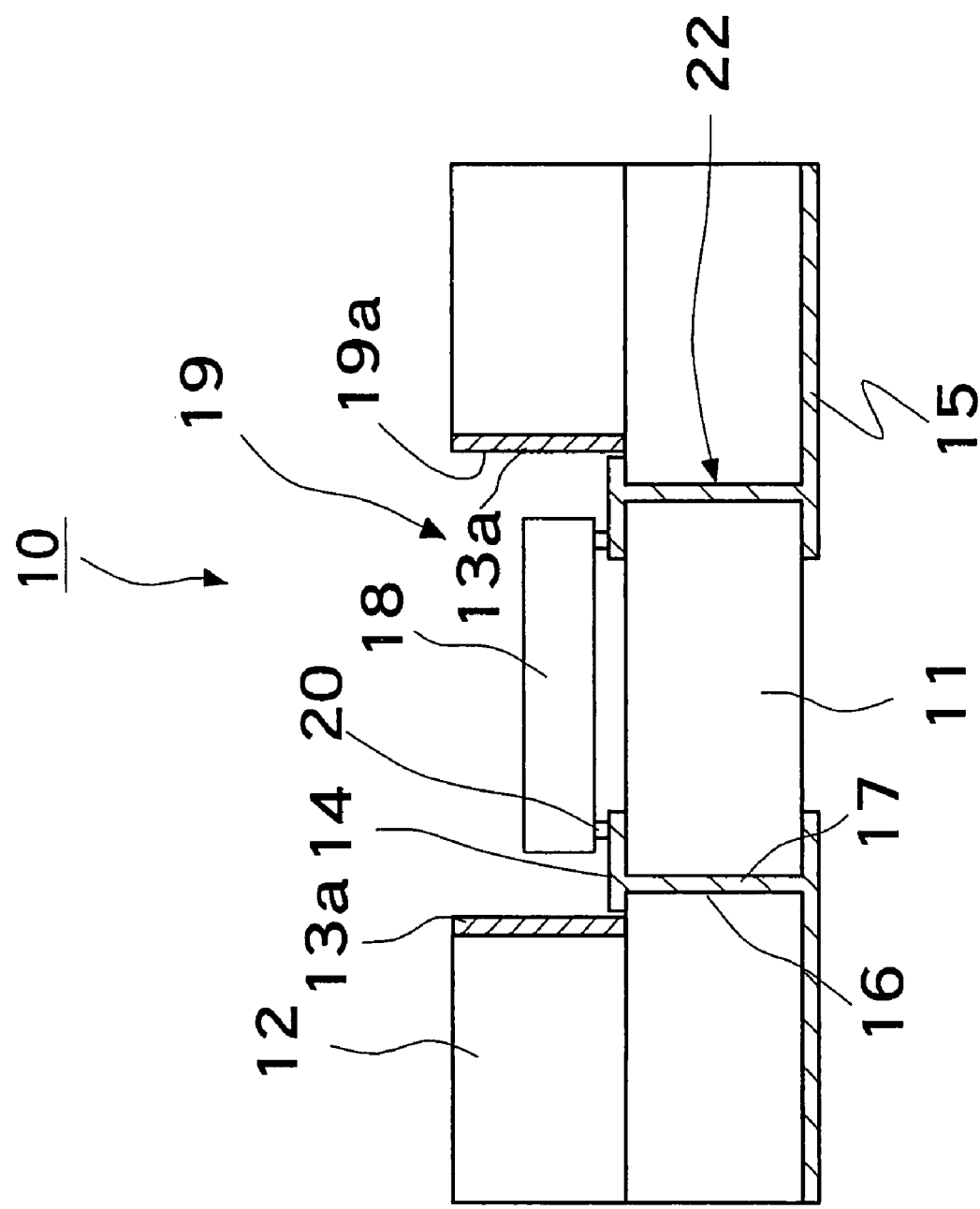
FIG. 5 is a sectional view showing another embodiment of the light-emitting element storing package of this invention.
Figure 6:
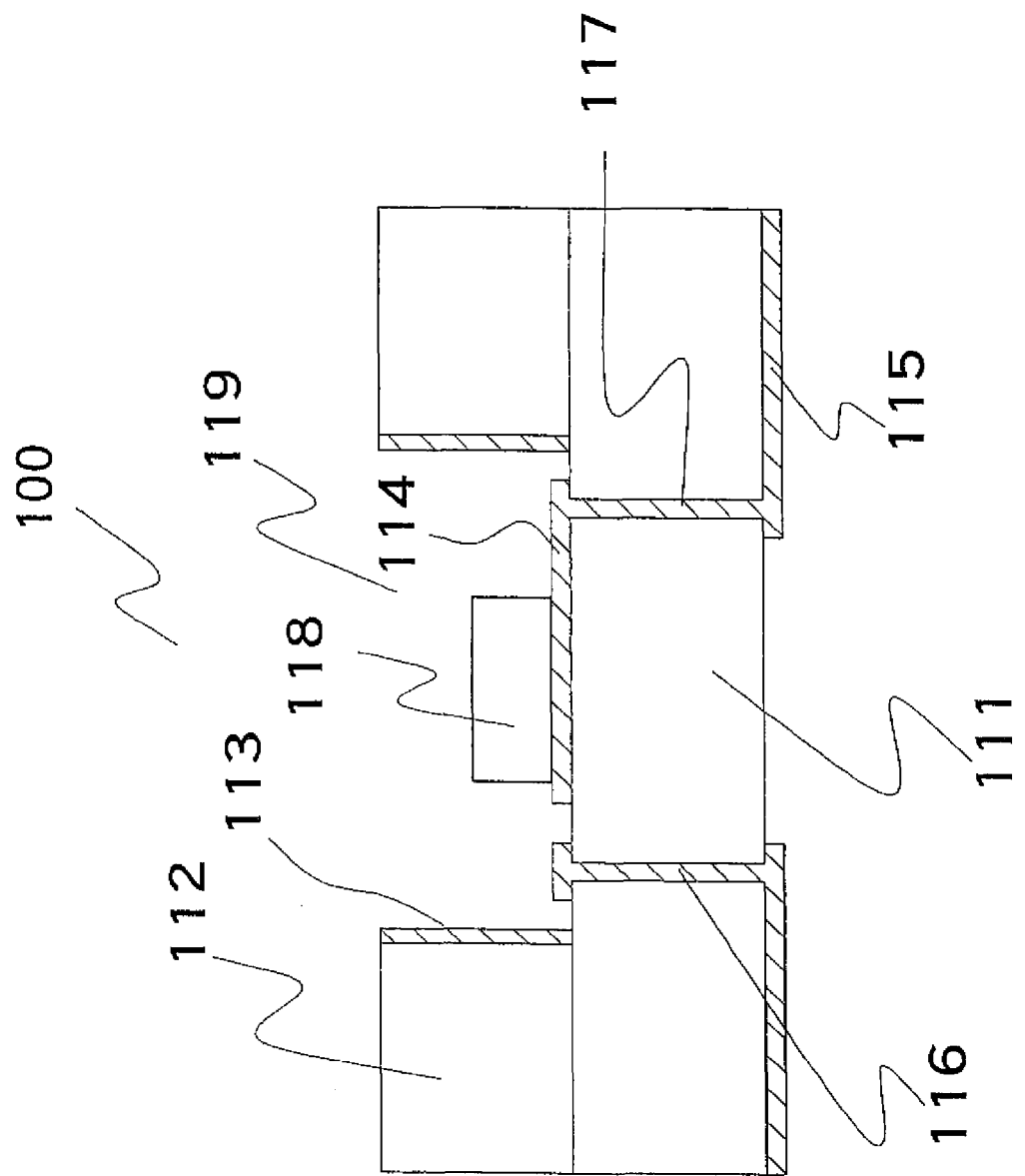
FIG. 6 is a sectional view of the conventional light-emitting element storing package.
Figure 7:
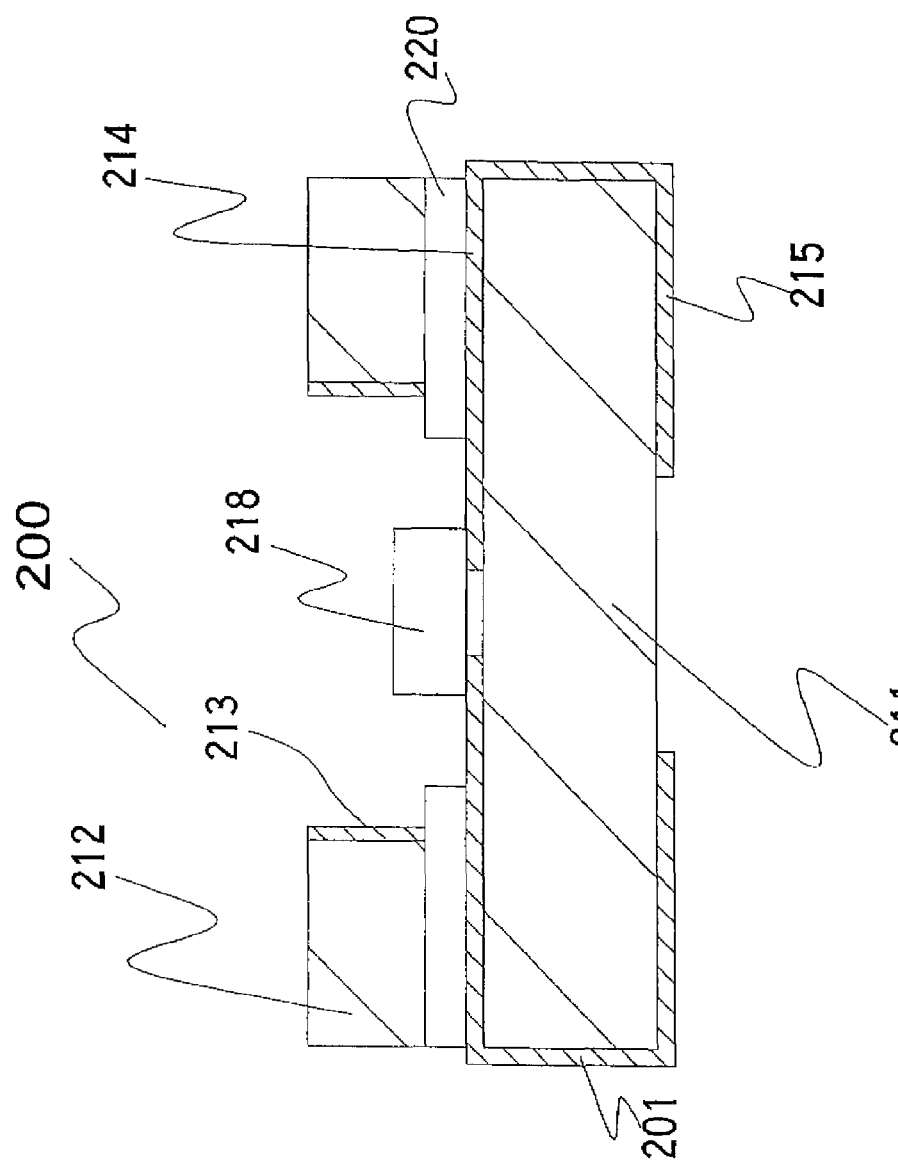
FIG. 7 is a sectional view of the conventional light-emitting element storing package.
Figure 8:
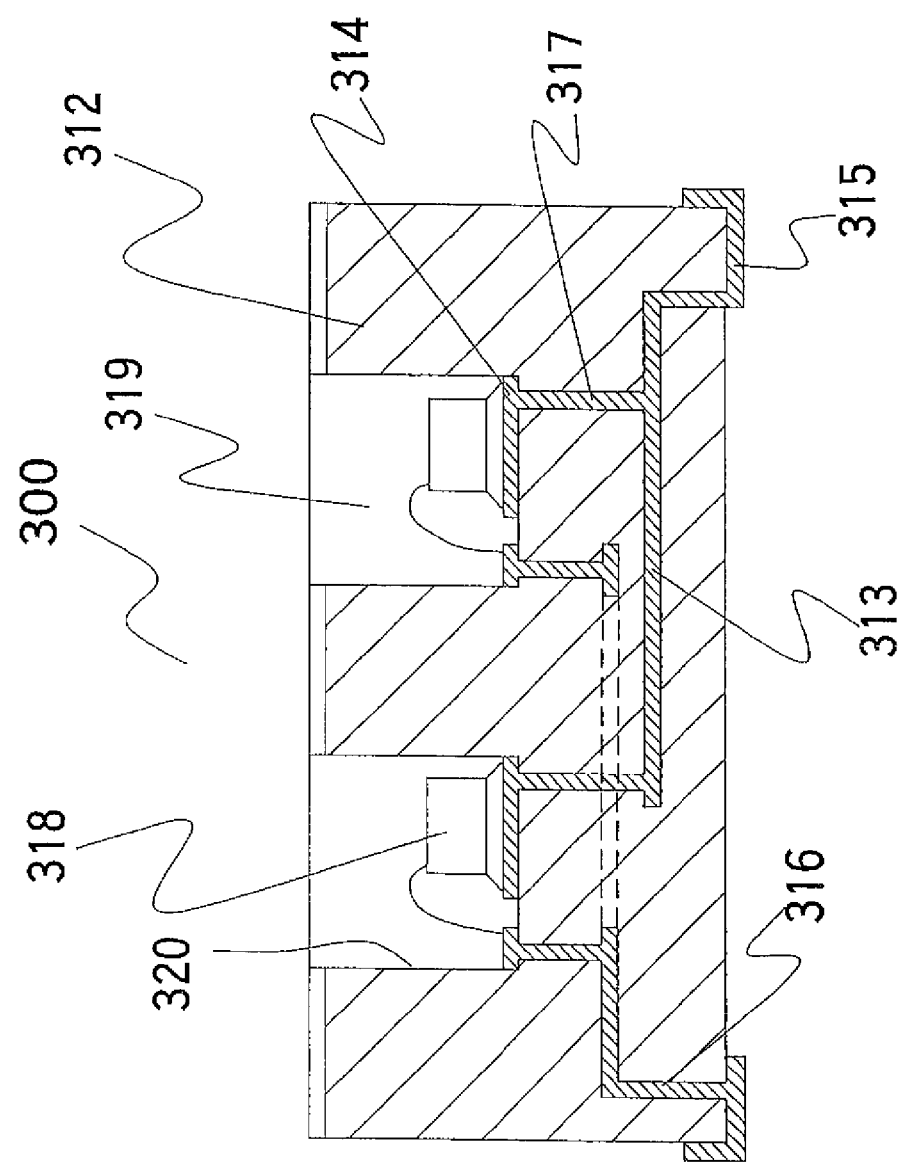
FIG. 8 is a sectional view of the conventional light-emitting element storing package.

FIG. 5 is a sectional view showing another embodiment of the light-emitting element storing package of this invention.

The light-emitting element storing package 10 of this embodiment shown in FIG. 5 is basically identical in construction to those shown in FIGS. 1 and 2 and like reference numerals are used to denote like parts or members in all of these drawings.

In the light-emitting element storing package 10 of this embodiment, as shown in FIG. 5, a reflector frame 12 is composed of nitride ceramics. Moreover, a light-reflecting layer 13a composed of white ceramics is provided on the surface to be a light-reflecting surface, i.e. inner side surface of the reflector frame 12.

In this way, the reflector frame 12 is composed of nitride ceramics and the light-reflecting layer 13a composed of white ceramics is provided on the surface thereof. Furthermore, this light-reflecting layer 13a composed of white ceramics has a high light reflectance and the light emitted from the light-emitting element can be reflected by the reflector frame 12 itself. As a result, the light is steadily and effectively reflected so that the brightness of the light-emitting element can be improved.

In addition, the thermal conductivity of the nitride ceramics constituting the main material of the reflector frame 12 is relatively high and the light-reflecting layer 13a is thin. Accordingly, even if the thermal conductivity of the white ceramics constituting this light-reflecting layer is low, the thermal conductivity of the reflector frame 12 as a whole is high.

As a result, the heat emitted from the light-emitting element is not accumulated in the light-emitting element storing package 10 and the heat is emitted outside through the reflector frame 12, so that the possibility the light-emitting element 18 is damaged become low.

Description will now be made in detail of the light-reflecting layer 13a composed of white ceramics which is formed on the surface of the reflector frame 12.

In this case, with respect to the light-reflecting layer 13a composed of white ceramics, it is desirable that its reflectance for light having a wavelength of 350 to 800 nm is 60% or more, or more preferably 80% or more.

If the reflectance of the white ceramics constituting the light-reflecting layer 13a on the surface of the reflector frame 12 is within that range, the light emitted from the light-emitting element 18 is effectively emitted toward the light output surface side, so that its brightness can be improved.

In addition, with respect to the light-reflecting layer composed of white ceramics, it is desirable that its reflectance for light having a wavelength of 400 nm is 80% or more, or more preferably 90% or more.

In this way, the reflectance for light having a wavelength of 400 nm is high. Therefore, for example, if a blue light-emitting element for a white LED is used as the light-emitting element 18, the light emitted from the light-emitting element 18 can be effectively reflected, so that its brightness can be improved.

Moreover, as for the nitride ceramics constituting the main material of the reflector frame 12, for example, nitride ceramics such as aluminum nitride ceramics, silicon nitride ceramics, boron nitride ceramics and the like can be used. In this case, in view of thermal conductivity, it is suitable that aluminum nitride ceramics is used.

In this case, to a powder of such ceramic material, an organic solvent such as alcohol or toluene, a suitable organic binder, a plasticizer such as a glycerol compound, a dispersant, etc. are added, so that a slurry is prepared. Furthermore, this slurry is formed into a sheet having an appropriate thickness by sheet-forming technology, such as a method using a doctor blade.

In addition, as for the organic binder, it is possible to use any known binder employed usually in preparing a green sheet, such as polyvinyl butyral, ethyl cellulose or an acrylic resin.

In this case, since moldability (formability) of a green sheet is good, it is suitable to use poly(n-butyl methacrylate) or polyvinyl butyral, etc.

After the sheet is formed, a layer consisting of a composition containing white ceramics is applied on the surface of the nitride sintered ceramics constituting the main material of the reflector frame 12. Thereafter, the degreasing and the calcining may be performed.

In this case, as for the white ceramic which forms the layer consisting of the white ceramics formed on the surface of the formed product of nitride ceramics, known white ceramics, such as boron nitride, aluminum oxide, (white) aluminum nitride, magnesium oxide or titanium oxide, can be used. Among these ceramics, since reflectance is high after sintering, it is preferable that boron nitride ceramics is used.

Moreover, as for the application method, known application methods, such as a method in which a paste containing a powder of the ceramic material is printed or spray coating method can be adopted.

In this case, in order to improve the adhesion property against the underlying layer, same nitride ceramics powder as the nitride ceramics of the underlying layer may be added in the paste. Moreover, as for the white ceramics powder, only one kind of the powder may be used or mixture of the different kinds of the powder may be used.

In this case, in order not to oxidize metal, such as tungsten, the degreasing of the green body is performed by heat treating the green body, in a reducing gas such as hydrogen, an inert gas such as argon or nitrogen, carbon dioxide, or a mixture of those gases, or a wet gas atmosphere formed by adding water vapor.

Moreover, in accordance with the kind and amount of the organic component contained in the green body, the degreasing may be performed under conditions selected from a temperature of 250° C. to 1,200° C. and a holding time of one to 1,000 minutes.

As for the condition of the sintering, calcining may be performed under the conditions including a temperature of from 1,600° C. to 2,000° C. and preferably from 1,750° C. to 1,850° C. and a calcining time of from one to 20 hours and preferably from 2 to 10 hours. As for the atmosphere of this sintering, sintering may be performed in a non-oxidizing gas atmosphere at a normal pressure.

Moreover, as for the thickness of the light-reflecting layer 13a of white nitride ceramics formed by this application forming treatment, it is desirable that the thickness is 1 to 1,000 µm, or more preferably from 20 to 500 µm in view of its reflectance and mechanical strength.

In addition, in this embodiment, on the inner side surface of the reflector frame 12, the light-reflecting layer 13a, which is formed by applying the white nitride ceramics thereon, is provided. However, the light-reflecting layer 13a can be also provided on the bottom surface of the light-emitting element storing concave portion 19 of the substrate 11.

Furthermore, the substrate 11 and the reflector frame 12 may be also consisting of the white nitride ceramics as the above embodiment as shown in FIG. 1. As a result, on the surface thereof, a light-reflecting layer 13a of another white ceramics can be formed as explained above.

With respect to the formation of a light-reflecting layer consisting of white ceramics, it may be also performed after the green body of nitride ceramics, which is formed into the configuration of the reflector frame, is calcinated.

In this case, firstly, using an ordinary green sheet of nitride ceramics, according to the method shown in FIG. 3A to 3D, the light-emitting element storing package perform having a reflector frame 12 consisting of nitride ceramics (sintered compact) is produced. In this case, as for the calcining condition, ordinary calcination condition may be adopted.

Then, on the surface to be a light-reflecting surface on the reflector frame 12 of the obtained preform, a nitride ceramics paste is applied. Thereafter, if required, the degreasing treatment is performed and then the preform is calcinated in an atmosphere containing a reducing gas in such a condition that voids having a diameter of 0.1 µm or larger is remained in the sintered compact which is obtained by sintering the nitride ceramics paste.

That is to say, in the method mentioned before, the white ceramics paste is applied on the surface of the green body of nitride ceramics, which is formed in the configuration of the reflector frame, and is simultaneously calcinated. On the contrary, in this method, on the surface of the reflector frame 12 which has been already sintered, the nitride ceramics paste is baked by postponed calcining, so that a white nitride ceramics layer is formed thereon.

As for the thickness of the light-reflecting layer 13a of white nitride ceramics thus formed, it is desirable that the thickness is 1 to 1,000 μm, and preferably from 20 to 500 μm, in view of its reflectance and mechanical strength.

In this method, as for the nitride ceramics paste which is applied on the surface of the reflector frame 12, same paste which is used in producing the green body of the reflector frame 12 (i.e. the paste prepared by mixing a nitride ceramics powder, an organic solvent, and an organic binder, etc) can be used.

Generally, where the nitride ceramics paste is not applied on the sintered compact substrate and is formed and calcinated as a green body (or a green sheet), the green body can be contracted in three dimensionally. As a result, the nitride ceramics particles is grown up with gathering neighboring particles, so that the dense sintered compact in which large crystal grains are close together can be formed.

On the contrary, in this method, the nitride ceramics paste is calcinated under such a state that it is applied on the surface of the sintered compact which has been already sintered. Therefore, the horizontal contraction of the paste against the surface of the sintered compact is restricted, the sufficient grain growth can not be obtained, so that the voids is remained along the grain boundary.

For this reason, it is supposed that, with respect to the nitride ceramics sintered compact, a diffused reflection of light is easily occurred and a high reflectance of light is exhibited.

From the principle of this whitening, it is considered that, if the voids can be introduced into the grain boundary, the whitening can be obtained irrespective of the kind of the nitride ceramics in the paste.

However, in view of the adhesion between the reflector frame 12 and its light-reflecting layer, it is desirable that the nitride ceramics constituting both members are consisting of same kind of ceramics.

In the method described before, in which a white ceramics paste and a green body of reflector frame 12 are calcinated simultaneously (co-fired), the kind of the nitride ceramics constituting the reflector frame 12 and the kind of the white ceramics are usually different from each other. As a result, it is difficult to achieve a high adhesive strength therebetween.

On the contrary, in this method, the both are consisting of same kind of the nitride ceramics (however, they are heterogeneous since the micro structures of the sintered compact are different). As a result, the adhesion strength of the light-reflecting layer can be increased.

In this method, as for the degreasing of the preform if required, the preform on which the nitride ceramics paste is applied is heat-treated in the atmosphere of an oxidizing gas such as oxygen or air, a reducing gas such as hydrogen, an inert gas such as argon or nitrogen, carbon dioxide, or a mixture of those gases, or a wet gas atmosphere formed by adding water vapor.

In addition, as for the heat treating condition, in accordance with the kind and amount of an organic component contained in the paste, it may be selected from the range of a temperature of 250° C. to 1,200° C. and a holding time of one to 1,000 minutes.

As for the calcining performed continuously after degreasing, it is necessary to perform under the condition that voids having a diameter of 0.1 μm or larger remain on the obtained sintered compact. In order to retain the voids (air holes) in the sintered compact, the calcination is performed in the atmosphere containing a reducing gas. In addition, the calcining temperature in this calcination is lower than the calcining temperature when the calcining is performed to obtain a dense sintered compact.

In this method, since the contraction in the direction of two-dimension of the paste is restricted, even if the sintering is performed at such temperature that the voids (air holes) are vanished in case of the calcinations of the green body, the voids are remained.

For example, where the nitride ceramics containing in the nitride ceramics paste is aluminum nitride, the calcining temperature may be temperature of from 1,600° C. to 1,780° C., preferably from 1,650° C. to 1,780° C. and more preferably from 1,700° C. to 1,750° C.

Although the calcining time is not specifically limited, the calcining may be performed in the time from 1 to 20 hours, and preferably from 2 to 10 hours. Where the calcining temperature is below 1,600° C., the sintering of aluminum nitride particles is insufficient and the strength of the sintered compact is low. Furthermore, where the calcining is performed at a temperature over 1,780° C., the voids in the grain boundary are vanished so that a high reflectance of light can not be obtained.

With respect to the above calcination, it is necessary that the calcining should be performed in an atmosphere containing a reducing gas, preferably an inert gas atmosphere containing carbon vapor as a reducing gas. If the calcination is performed in an atmosphere not containing any reducing gas, there is possibility that a product having a low reflectance of light is obtained.

The concentration of the reducing gas in the atmosphere depends on the sintering assistant which is contained in the aluminum nitride paste. Therefore, where the sintering additive (aids) is a compound containing an alkaline earth metal, the weak reducing atmosphere explained above is suitable.

In addition, where the sintering additive (aids) is a rare earth oxide, such as yttrium oxide, a weak reducing atmosphere or an atmosphere in which the carbon vapor concentration is still lower is preferable.

Where a rare earth oxide, such as yttrium oxide is used as the sintering additive (aids), although depending on the calcining temperature, when the calcining is performed in an atmosphere in which reducing gas is not contained entirely, there is possibility that the voids in the grain boundary is decreased and a reflectance of light is lowered.

In this case, the diameter of the voids in a sintered compact having such voids in the grain boundary may be ascertained by determining the diameter of the voids found in a SEM of a section of the sintered compact. A diameter of the voids as described herein means a maximum diameter thereof.

Description will now be made in further detail of this invention based on several examples thereof, though these examples are not intended to limit the scope of this invention.

Example 1

This is an example in which a reflector frame is consisting of white nitride ceramics.

100 parts by mass of aluminum nitride powder having an average particle diameter of 1.5 μm and an oxygen content of 0.8% by weight, 5 parts by mass of $3CaO.Al_2O_3$, poly(n-butyl methacrylate) as a binder, dibutyl phthalate as a plasticizer, tetraglycerol monooleate as a surface active agent (surfactant) and toluene as a solvent were mixed using a ball mill.

The slurry prepared by this mixing was formed into a sheet by using a doctor blade method so that a green sheet for a reflector frame and a green sheet for an insulating substrate, both having a thickness of 0.4 mm, were formed respectively.

The green sheet for a reflector frame was punched out so that a through-hole 19a for defining a light-emitting element storing concave portion 19 was formed. In addition, green sheet for an insulating substrate was also punched out so that a through-hole 16 was formed.

Then, a paste containing tungsten was filled into the through-hole 16 which was formed in the green sheet for an insulating substrate. In addition, wiring patterns 14 and 15 were printed with the same paste.

Thereafter, the two green sheets were superposed on each other and the resulting laminate was degreased by heating at 850° C. for two hours in the presence of hydrogen gas containing water and flowing at a rate of 10 liters per minute. In this case, a heating rate of 2.5° C. per minute was employed for its degreasing.

Then, the degreased product and a carbon board having a surface area of 320 mm² were placed in a covered vessel in such a way as not to contact each other. In this case, the vessel was made of carbon, having an internal volume of 84 cm³ and having an inner wall consisting of boron nitride. In addition, the degreased product was placed on a board of aluminum nitride.

In this case, the carbon board had been prepared by cutting a standard carbon board, which has 40 mm square and 3 mm in thickness and which has a weight of 18 g, into one-fourth of its size (10 mm by 10 mm by 3 mm).

Moreover, in this vessel, when the inside of the vessel changes into a pressurization state by heating, its lid is slightly lifted by the elevated pressure. As a result, a clearance is formed between the vessel and its lid so that the internal pressure of the vessel is maintained substantially equal to its external pressure.

Thereafter, the vessel was carried into a carbon furnace and the degreased product was sintered in a nitrogen atmosphere by holding for 15 hours at a temperature of 1,860° C. and a normal pressure. As a result, a sintered compact, i.e. a light-emitting element storing package as shown in FIG. 1 was obtained.

The sintered compact was examined for its thermal conductivity, its reflectance of light having a wavelength of 350 to 800 nm (or simply referred to as "light reflectance") and its density. The results are shown in Table 1 and Table 2, which shows its reflectance of light at different wavelengths.

In addition, the thermal conductivity of the sintered compact was determined by the laser-flash method using "Thermal Constant Determining Device, PS-7", of Rigaku Denki K. K. In this case, its correction by thickness was made in accordance with a working curve.

Moreover, its reflectance of light having a wavelength of 350 to 800 nm was determined by the integrating sphere method using a spectrophotometer made by Hitachi Seisakusho.

Table 1 shows its lowest reflectance of light in the above wavelength range and its reflectance of light at a wavelength of 400 nm. Furthermore, its density was determined by the Archimedian method using an automatic gravimeter and an electronic even balance made by Toyo Seiki.

Example 2

This is an example in which a reflector frame was consisting of white nitride ceramics.

As shown in Table 1, the standard carbon board was cut into one-eighths of its size and the cut carbon board was placed into the vessel and a sintered compact was obtained by using same method as Example 1.

With respect to the obtained sintered compact, the thermal conductivity, reflectance of light having a wavelength of 350 to 800 nm and its density were determined by using same determining method as the Example 1. The results are shown in Tables 1 and 2.

Comparative Example 1

This is an example in which a reflector frame was consisting of known nitride ceramics.

100 parts by weight of aluminum nitride powder, 5.0 parts by weight of yttrium oxide, 1.0 part by weight of tetraglycerol monooleate as a surface active agent (surfactant), 40 parts by weight of toluene as a solvent, 13 parts by weight of poly(n-butyl methacrylate) as a binder and 4.2 parts by weight of dibutyl phthalate, 10 parts by weight of toluene and 5 parts by weight of butyl acetate as a plasticizer were mixed using a ball mill. As a result, a white slurry was obtained.

The slurry prepared by this mixing was formed into a sheet by using a doctor blade method so that a green sheet for a reflector frame and a green sheet for an insulating substrate, both having a thickness of 0.4 mm, were formed respectively.

The obtained two green sheet were punched out and the paste containing tungsten was filled and printed in the green sheet and then they were superposed to form a laminate and thereafter the degreasing was performed by using same method as the Example 1.

After degreasing, the degreased product was placed in a vessel made of aluminum nitride and heated at 1,800° C. for five hours in a nitrogen atmosphere so that a sintered compact was obtained.

The obtained sintered compact had a gray color appearing to transmit light.

With respect to the obtained sintered compact, the thermal conductivity, reflectance of light having a wavelength of 350 to 800 nm and its density were determined by using same determining method as Example 1. The results are shown in Tables 1 and 2.

TABLE 1

|  | Cut size of carbon board | Surface area of carbon board (mm²) | Thermal conductivity (W/m · K) | Minimum light reflectance (%) at 350 to 800 nm | Light reflectance (%) at 400 nm | Density (g/cm³) |
| --- | --- | --- | --- | --- | --- | --- |
| Example 1 | ¼ | 320 | 170 | 51 | 56 | 3.24 |
| Example 2 | ⅛ | 110 | 144 | 68 | 70 | 3.11 |
| Comparative Example 1 | — | — | 174 | 31 | 35 | 3.32 |

TABLE 2

|  | 300 nm | 360 nm | 380 nm | 400 nm | 430 nm | 500 nm | 600 nm | 700 nm | 780 nm |
|---|---|---|---|---|---|---|---|---|---|
| Example 1 | 36 | 51 | 53 | 56 | 60 | 65 | 68 | 69 | 67 |
| Example 2 | 61 | 69 | 69 | 70 | 72 | 77 | 79 | 80 | 76 |
| Comparative Example 1 | 28 | 31 | 33 | 35 | 38 | 41 | 42 | 43 | 40 |

As is obvious from the results shown in Tables 1 and 2, the sintered compact of white nitride ceramics according to this invention has a higher reflectance of light than that of known nitride ceramics. Furthermore, the sintered compact of this invention does not lower its reflectance even at a wavelength of 400 nm.

Therefore, if the sintered compact of this invention is used for a reflector frame 12 in a light-emitting element storing package 10, for example, where a white LED is used as the light-emitting element 18, the light emitted from the light-emitting element is effectively reflected so that its brightness can be improved.

Example 3

This is an example in which a light-reflecting layer consisting of an oxide was provided on the surface of a reflector frame.

A sintered compact, which had been obtained in accordance with Comparative Example 1, had been treated by heating at 1,200° C. for five hours in the open air, so that the surface of the sintered compact was oxidized.

An oxide film (layer) of alumina ($Al_2O_3$) having a thickness of 20 μm was formed on the surface of the sintered compact and its color tone was white.

With respect to the obtained sintered compact, the thermal conductivity, reflectance of light having a wavelength of 350 to 800 nm and its density were determined by using same determining method as Example 1. The results are shown in Tables 3.

Comparative Example 2

A sintered compact, which had been obtained by using same method as Comparative Example 1, was subjected to oxidation in an oxygen atmosphere by using same method as Example 3. In this case, the oxidation time was shortened to one hour.

An oxide film (layer) of alumina ($Al_2O_3$) having a thickness of 2 μm was formed on the surface of the sintered compact and its color tone was light gray.

With respect to the obtained sintered compact, the thermal conductivity, reflectance of light having a wavelength of 350 to 800 nm and its density were determined by using same determining method as Example 1. The results are shown in Tables 3.

As is obvious from the results shown in Table 3, the sintered compact having on its surface a light-reflecting layer consisting of an oxide by oxidation treatment according to this invention has a high reflectance of light. Furthermore, the sintered compact has a high reflectance of light particularly against the light of a wavelength of 300 to 400 nm.

Therefore, if the sintered compact of this invention is used for a reflector frame 12 in a light-emitting element storing package 10, for example, where a white LED is used as the light-emitting element 18, the light emitted from the light-emitting element is effectively reflected so that its brightness can be improved.

Example 4

This is an example in which a light-reflecting layer was provided on the surface of a reflector frame by coating it with white nitride ceramics (boron nitride).

Sheets were obtained by using method as Example 3. Then, on the inner side surface and the surface of the green sheet to be a reflector frame 12, a paste consisting of 100 parts by weight of boron nitride powder, ethyl cellulose and a solvent was applied by printing to form a 15-μm thick layer.

Thereafter, using same method as Example 3, the forming of conductor patterns, the laminating of the green sheet, degreasing, and calcination were performed. As a result, the layer of the white nitride ceramics consisting of boron nitride was formed in the surface of the sintered compact. In addition, the color tone of this sintered compact was white.

With respect to the obtained sintered compact, the thermal conductivity, reflectance of light having a wavelength of 350 to 800 nm and its density were determined by using the same determining method as Example 1. The results are shown in Table 4.

Example 5

This is an example in which a light-reflecting layer was provided on the surface of a reflector frame by coating it with white nitride ceramics (using boron nitride and aluminum oxide).

A sintered compact was obtained by using same method as Example 4. In this case, on the surface of the inner side surface and the surface of the reflector frame 12, a paste consisting of 68 parts by weight of boron nitride powder, 23 parts by weight of aluminum oxide powder, 9 parts by weight

TABLE 3

|  | 300 nm | 360 nm | 380 nm | 400 nm | 430 nm | 500 nm | 600 nm | 700 nm | 780 nm |
|---|---|---|---|---|---|---|---|---|---|
| Example 3 | 90.3 | 84.7 | 84.7 | 84.0 | 81.9 | 77.1 | 72.2 | 67.4 | 63.9 |
| Comparative Example 2 | 26.4 | 29.2 | 31.9 | 34.7 | 37.5 | 40.3 | 41.7 | 42.4 | 39.6 | of yttrium oxide powder, ethyl cellulose and a solvent was applied by printing to form a 15-μm thick layer.

In addition, the color tone of the obtained light reflecting-layer was white.

With respect to the obtained sintered compact, the thermal conductivity, reflectance of light having a wavelength of 350 to 800 nm and its density were determined by using the same determining method as Example 1. The results are shown in Table 4.

Example 6

This is an example in which a light-reflecting layer was provided on the surface of a reflector frame by coating it with white nitride ceramics (using boron nitride and aluminum nitride).

A sintered compact was obtained by using same method as Example 4. In this case, on the surface of the inner side surface and the surface of the reflector frame 12, a paste consisting of 68 parts by weight of boron nitride powder, 23 parts by weight of aluminum nitride powder, 9 parts by weight yttrium oxide powder, ethyl cellulose and a solvent was applied by printing to form a 15-μm thick layer.

In addition, the color tone of the obtained light reflecting-layer was white.

With respect to the obtained sintered compact, the thermal conductivity, reflectance of light having a wavelength of 350 to 800 nm and its density were determined by using the same determining method as Example 1. The results are shown in Table 4.

Example 7

This is an example in which a light-reflecting layer was provided on the surface of a reflector frame by coating it with white nitride ceramics (using boron nitride and magnesium oxide).

A sintered compact was obtained by using same method as Example 4. In this case, on the surface of the inner side surface and the surface of the reflector frame 12, a paste consisting of 45 parts by weight of boron nitride powder, 45 parts by weight of magnesium oxide powder, 9 parts by weight of yttrium oxide powder, ethyl cellulose and a solvent was applied by printing to form a 15-μm thick layer.

In addition, the color tone of the obtained light reflecting-layer was white.

With respect to the obtained sintered compact, the thermal conductivity, reflectance of light having a wavelength of 350 to 800 nm and its density were determined by using the same determining method as Example 1. The results are shown in Table 4.

Example 8

This is an example in which a light-reflecting layer was provided on the surface of a reflector frame by coating it with white nitride ceramics (using boron nitride, boron oxide and aluminum nitride).

A sintered compact was obtained by using same method as Example 4. In this case, on the surface of the inner side surface and the surface of the reflector frame 12, a paste consisting of 68 parts by weight of boron nitride powder, 9 parts by weight of boron oxide powder, 23 parts by weight of aluminum nitride powder, ethyl cellulose and a solvent was applied by printing to form a 15-μm thick layer.

In addition, the color tone of the obtained light reflecting-layer was white.

With respect to the obtained sintered compact, the thermal conductivity, reflectance of light having a wavelength of 350 to 800 nm and its density were determined by using the same determining method as Example 1. The results are shown in Table 4.

TABLE 4

|  | 300 nm | 360 nm | 380 nm | 400 nm | 430 nm | 500 nm | 600 nm | 700 nm | 780 nm |
| --- | --- | --- | --- | --- | --- | --- | --- | --- | --- |
| Example 4 | 99 | 93 | 93 | 92 | 92 | 88 | 86 | 84 | 83 |
| Example 5 | 82 | 79 | 79 | 78 | 77 | 77 | 75 | 74 | 72 |
| Example 6 | 92 | 85 | 84 | 83 | 82 | 80 | 78 | 76 | 75 |
| Example 7 | 91 | 88 | 86 | 85 | 85 | 83 | 81 | 79 | 78 |
| Example 8 | 100 | 95 | 94 | 92 | 92 | 90 | 87 | 86 | 84 |

As is obvious from the results shown in Table 4, the sintered compact having a light-reflecting layer formed by coating with white nitride ceramics has a high reflectance of light. Furthermore, the sintered compact has a high reflectance of light particularly against the light of a wavelength of 300 to 400 nm.

Therefore, if the sintered compact of this invention is used for a reflector frame 12 in a light-emitting element storing package 10, for example, where a white LED is used as the light-emitting element 18, the light emitted from the light-emitting element is effectively reflected so that its brightness can be improved.

Example 9

This is an example in which a white nitride ceramics layer was formed by post-fire method in which a nitride ceramics paste on the surface of the reflector frame is calcined.

Using same method as Comparative Example 1, a preform for a light-emitting element storing package having a reflector frame consisting of a sintered compact of aluminum nitride was prepared.

Then, 100 parts by mass of aluminum nitride powder having an average particle diameter of 1.5 μm (an oxygen concentration of 0.8% by mass), 5 parts by mass of yttrium oxide ($Y_2O_3$) powder having an average particle diameter of 0.5 μm, 9 parts by weight of ethyl cellulose and 40 parts by weight of terpineol were kneaded. As a result, an aluminum nitride paste having a viscosity of 3,500 P at 25° C. was prepared.

Thereafter, the aluminum nitride paste was applied on the light-reflecting surface of the reflector frame in the preform package by screen printing to form a thickness of 300 μm and was dried at 80° C. for five minutes.

The preform on which the paste had been thus applied was calcinated by using same condition as Example 1, except for employing a calcining temperature of 1,740° C. and a calcining time of four hours. As a result, a light-emitting element storing package having a light-reflecting surface consisting of white aluminum nitride was obtained.

Figure 9:
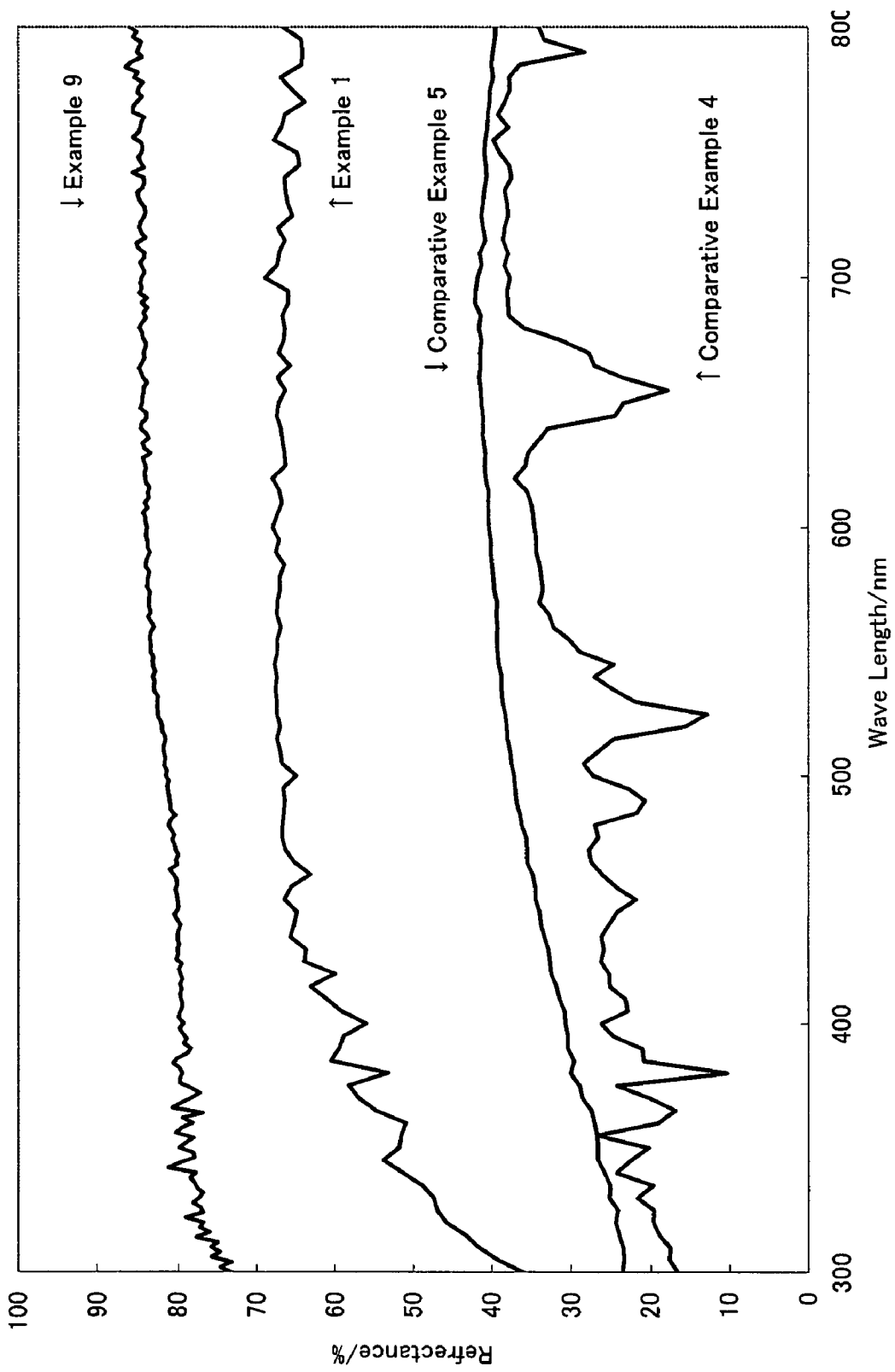
FIG. 9 is a graph showing the reflectance of light having a wavelength of 350 to 700 nm by each of the light-reflecting surfaces of the reflector frames in the light-emitting element storing packages according to Examples 1 and 9 and the surfaces of the sintered compacts according to Comparative Examples 4 and 5.

With respect to the obtained light-reflecting surface of the package, reflectance of light having a wavelength of 350 to 800 nm was determined by using same determining method as Example 1. The results are shown in FIG. 9. In addition, FIG. 10 indicates a microphotograph (SEM) showing a fractured section of the light-reflecting surface of the package.

Figure 10:
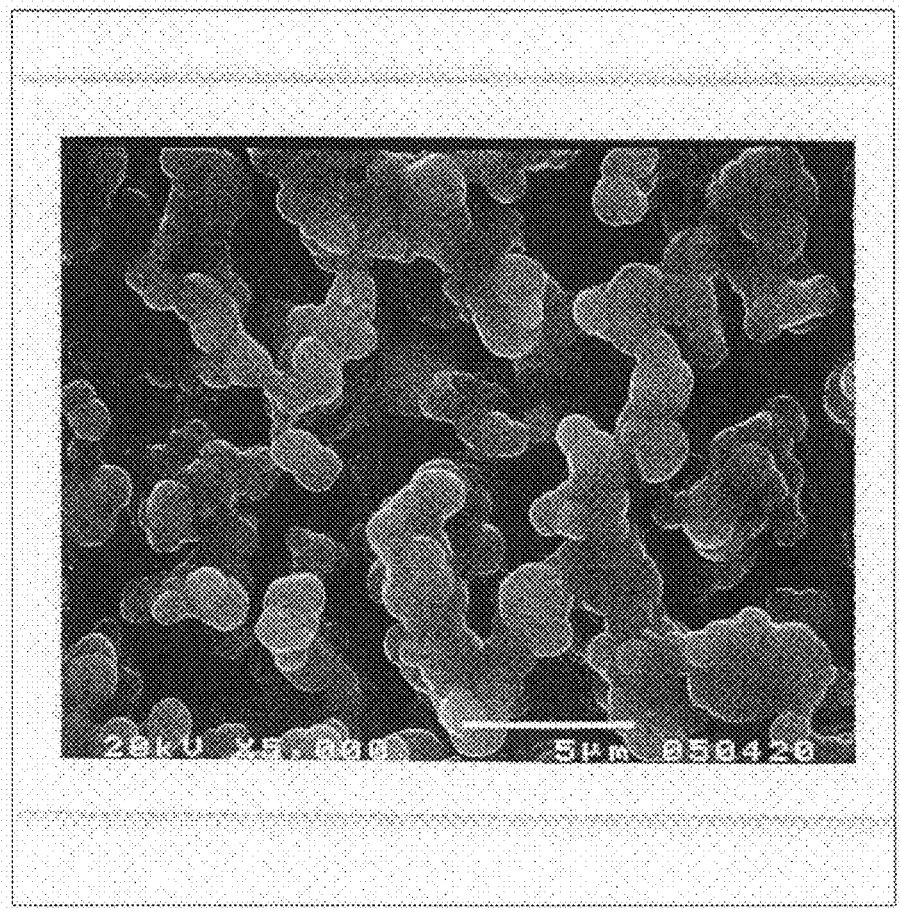
FIG. 10 is a photograph of scanning electron microscope (SEM) showing a section of the white sintered compact of aluminum nitride which constitutes the light-reflecting surface of the reflector frame in the light-emitting element storing package according to Example 9.

As is obvious from FIG. 10, it is confirmed that, in the sintered white aluminum nitride layer constituting the light-reflecting surface, there is a number of voids having a diameter of 0.1 μm or larger.

Comparative Example 3

This is an example in which the calcining was performed under the condition that no voids remained in the sintered compact, where a nitride ceramics paste was calcinated on the surface of a reflector frame by post calcining.

Using same method as Example 9, a package was obtained, except for by employing a preform calcining temperature of 1,850° C.

With respect to the obtained light-reflecting surface of the package, reflectance of light having a wavelength of 350 to 800 nm was determined by using same determining method as Example 1. In this case, its reflectance was same as that of the conventional aluminum nitride sintered compact (Comparative Example 5). That is to say, its reflectance was 45% or lower at any wavelength in the range from 350 to 700 nm.

In addition, although a microscope (SEM) observation of the fracture surface of the light-reflecting surface of the package was carried out, no voids were confirmed.

Comparative Example 4

This is an example in which a sintered compact of aluminum nitride was made by using erbium oxide (about 5% by mass) as a sintering additive (aids).

A green sheet was formed from a raw material, which had been prepared by adding 5 parts by mass of erbium oxide powder ($Er_2O_3$) as a sintering assistant to 100 parts by mass of aluminum nitride powder having an average particle diameter of 1.5 μm (an oxygen concentration of 0.8% by mass).

Then, the obtained green sheet was degreased and thereafter was calcinated, so that an aluminum nitride sintered compact was obtained.

In this case, as for the calcining, the degreased product (green sheet) was placed in the vessel used in Example 1 and the atmosphere therein was replaced with nitrogen without placing any carbon sheet and the calcinations was performed at a calcining temperature of 1,850° C. for four hours.

The obtained sintered compact was visually observed so that it had a pale pink color.

The light reflectance of the sintered compact was determined by using same determining method as Example 1. The results are shown in FIG. 9. Its light reflectance was 40% or lower at any wavelength in the range from 350 to 700 nm.

Comparative Example 5

This is an example in which an ordinary sintered compact of aluminum nitride was made by using yttrium oxide (about 5% by mass) as a sintering assistant.

A sintered aluminum nitride compact was obtained by same method as Comparative Example 4, except for employing yttrium oxide ($Y_2O_3$) instead of erbium oxide as the sintering assistant in Comparative Example 4.

The obtained sintered compact was visually observed so that it had a slightly transparent gray color.

The light reflectance of the sintered compact was determined by using same determining method as Example 1. The results are shown in FIG. 9. Its light reflectance was 45% or lower at any wavelength in the range from 350 to 700 nm.

Figure 11:
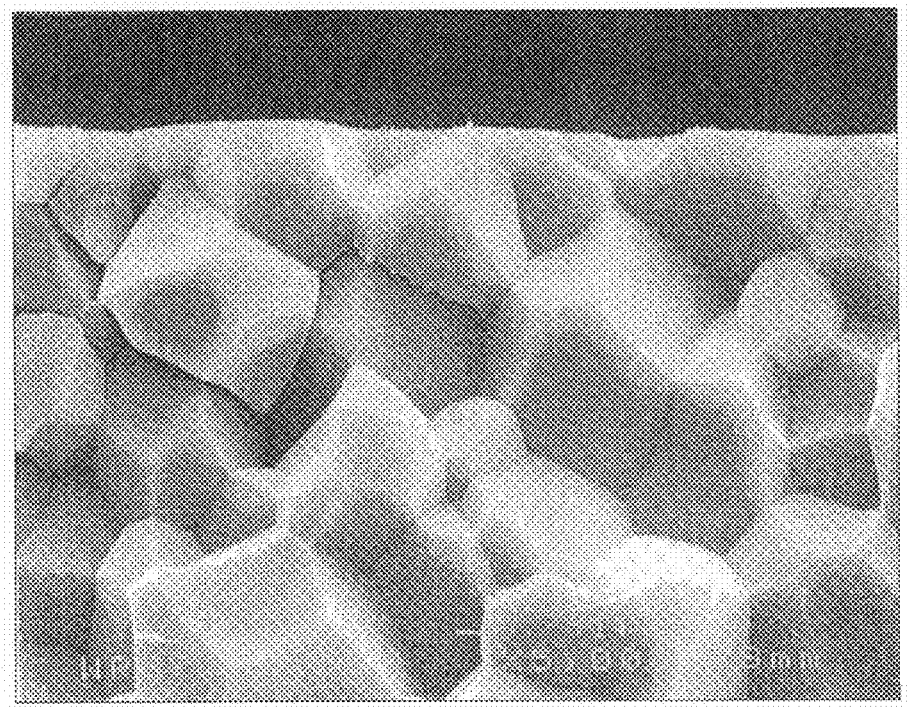
FIG. 11 is a SEM photograph showing a section of the conventional sintered compact of aluminum nitride according to Comparative Example 5.

FIG. 11 indicates a SEM showing a fractured section of the obtained sintered compact. From observation of FIG. 11, it is confirmed that no voids remained in the sintered compact.

While the invention has been described by way of preferred forms of its embodiment, various modifications may be made without departing from the scope and spirit of this invention, including its application to a package for storing any other type of light-emitting element, such as a semiconductor laser, though the preferred embodiments have all been intended for storing an LED.

The invention claimed is:

1. A light-emitting element storing package comprising:
   an insulating substrate composed of a ceramic having board like configuration,
   a reflector frame composed of a ceramic material, joined to the upper surface of the substrate along its outer edge and having an inner wall surface defining a light-reflecting surface,
   a wiring pattern layer formed on the upper surface of the substrate for connection with a light-emitting element, and
   a light-emitting element storing concave portion, defined by the substrate and the reflector frame therebetween,
   in which the light-emitting element is mounted on the wiring pattern layer in the light-emitting element storing concave portion,
   wherein the reflector frame is composed of: 1) a white aluminum nitride ceramics obtained by sintering a composition comprising an aluminum nitride and a sintering additive consisting of a compound containing an alkaline earth metal, and the light-reflecting surface of the reflector frame is composed of the white aluminum nitride ceramics, or
   (2) sintered nitride ceramics, and the light-reflecting surface of the reflector frame, which covers a surface of the sintered nitride ceramics, is composed of white ceramics consisting of a ceramics different in kind than the sintered nitride ceramics or a ceramics that is the same in kind as the sintered nitride ceramics but having a different microstructure.

2. A package according to claim 1, wherein the reflector frame is composed of the white aluminum nitride ceramics and the white aluminum nitride ceramics have a thermal conductivity of at least 140 W/m·K and a density of at least 3.10 g/cm$^3$.

3. A package according to claim 1, wherein the reflector frame is composed of the sintered nitride ceramics and the white ceramics of the light-reflecting surface is an oxide having a thickness of from 5 to 1,000 μm obtained by the oxidation of the sintered nitride ceramics constituting the reflector frame.

4. A package according to claim 1, wherein a reflectance of the light-reflecting surface for light having a wavelength of 350 to 800 nm is at least 50%.

5. A package according to claim 4, wherein a reflectance of the light-reflecting surface for light having a wavelength of 400 nm is at least 55%.

6. A package according to claim 1, wherein the reflector frame is composed of the white aluminum nitride ceramics obtained by sintering a composition comprising an aluminum nitride and a sintering additive consisting of a compound containing an alkaline earth metal and the light-reflecting surface of the reflector frame is composed of the white aluminum nitride ceramics.

7. A package according to claim 1, wherein the reflector frame is composed of the sintered nitride ceramics and the light-reflecting surface of the reflector frame, which covers a surface of the sintered nitride ceramics, is composed of white ceramics consisting of a ceramics different in kind than the sintered nitride ceramics or a ceramics that is the same in kind as the sintered nitride ceramics but having a different microstructure.

8. A package according to claim 7, wherein the sintered nitride ceramics are white nitride ceramics.

* * * * *

UNITED STATES PATENT AND TRADEMARK OFFICE
CERTIFICATE OF CORRECTION

| | | |
|---|---|---|
| PATENT NO. | : 7,737,461 B2 | Page 1 of 1 |
| APPLICATION NO. | : 11/659158 | |
| DATED | : June 15, 2010 | |
| INVENTOR(S) | : Maeda et al. | |

It is certified that error appears in the above-identified patent and that said Letters Patent is hereby corrected as shown below:

Title Page; Face of the Patent, Insert the following:

-- (30) Foreign Application Priority Data
Aug. 3, 2004    (JP) .................................2004-226943 --

Column 6, line 2, "thereby to thereby obtain" should read -- to thereby obtain --

Column 15, line 48, "using in used in" should read -- used in --

Signed and Sealed this

Fifth Day of October, 2010

David J. Kappos
*Director of the United States Patent and Trademark Office*